(12) United States Patent
Sato et al.

(10) Patent No.: US 8,614,500 B2
(45) Date of Patent: Dec. 24, 2013

(54) FILM FORMING APPARATUS, FILM FORMING METHOD, AND SEMICONDUCTOR DEVICE

(75) Inventors: Tsuyoshi Sato, Yokohama (JP);
Hiroyasu Kondo, Yokohama (JP);
Naoaki Sakurai, Yokohama (JP);
Katsuyuki Soeda, Yokohama (JP);
Kenichi Ooshiro, Yokohama (JP);
Shuichi Kimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 13/048,612

(22) Filed: Mar. 15, 2011

(65) Prior Publication Data

US 2011/0204490 A1    Aug. 25, 2011

Related U.S. Application Data

(63) Continuation of application No. PCT/JP2009/068912, filed on Nov. 5, 2009.

(30) Foreign Application Priority Data

Nov. 5, 2008 (JP) ................................. 2008-284652

(51) Int. Cl.
*H01L 23/58* (2006.01)
(52) U.S. Cl.
USPC ........... 257/632; 257/638; 438/758; 427/240; 427/421.1; 427/444
(58) Field of Classification Search
USPC ............... 257/632, 638; 427/240, 421.1, 644; 438/758
See application file for complete search history.

(56) References Cited

U.S. PATENT DOCUMENTS 3,887,733 A * 6/1975 Tolliver et al. ................. 427/444
5,770,258 A * 6/1998 Takizawa et al. ............... 427/64

(Continued)

FOREIGN PATENT DOCUMENTS

JP 58-206124 12/1983
JP 62-219923 9/1987

(Continued)

OTHER PUBLICATIONS

U.S. Appl. No. 13/214,409, Aug. 22, 2011, Sato et al.

(Continued)

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

According one embodiment, a film forming apparatus includes a stage, a coating section, a vapor supply section, a blower section, and a controller. On the stage, an coating target is placed. The coating section applies a material to a predetermined region on the coating target placed on the stage to form a coating film. The vapor supply section generates solvent vapor capable of dissolving the coating film. The blower section blows the solvent vapor generated by the vapor supply section onto the coating film on the coating target placed on the stage. The controller controls an amount of the solvent vapor to be blown by the blower section so that: the coating film is dissolved; viscosity in a part of the coating film on a surface layer side is lower than that in a part thereof on the coating target side; and the viscosity in the part on the surface layer side and the viscosity of the coating target side take such values that prevent the coating film on the coating target from spreading.

11 Claims, 16 Drawing Sheets

(56) References Cited

U.S. PATENT DOCUMENTS

| | | | |
|---|---|---|---|
| 6,368,523 B1* | 4/2002 | Buazza et al. | 264/1.36 |
| 6,383,294 B1* | 5/2002 | Nakamura et al. | 118/666 |
| 6,400,915 B2* | 6/2002 | Nukada | 399/94 |
| 6,800,928 B1* | 10/2004 | Lee et al. | 257/632 |
| 7,256,139 B2* | 8/2007 | Moghadam et al. | 438/758 |
| 7,549,567 B2* | 6/2009 | Higashi et al. | 228/110.1 |
| 2001/0033895 A1* | 10/2001 | Minami et al. | 427/240 |
| 2002/0022377 A1 | 2/2002 | Inada et al. | |
| 2002/0074623 A1* | 6/2002 | Sakurai et al. | 257/632 |
| 2003/0041971 A1 | 3/2003 | Kido et al. | |
| 2003/0062599 A1* | 4/2003 | Egami et al. | 257/632 |
| 2003/0099776 A1 | 5/2003 | Inada et al. | |
| 2003/0150108 A1* | 8/2003 | Higashi et al. | 29/840 |
| 2005/0100679 A1* | 5/2005 | Kitano et al. | 427/421.1 |
| 2005/0170087 A1* | 8/2005 | Minami et al. | 427/240 |
| 2006/0070702 A1 | 4/2006 | Kido et al. | |
| 2006/0090852 A1 | 5/2006 | Kido et al. | |
| 2006/0090853 A1 | 5/2006 | Kido et al. | |
| 2006/0130759 A1 | 6/2006 | Kido et al. | |
| 2009/0179307 A1* | 7/2009 | Zhou et al. | 257/632 |
| 2010/0021933 A1* | 1/2010 | Okano et al. | 435/7.1 |
| 2012/0064349 A1* | 3/2012 | Sato et al. | 428/411.1 |

FOREIGN PATENT DOCUMENTS

| | | | |
|---|---|---|---|
| JP | 63-185028 A | 7/1988 | |
| JP | 1-238017 A | 9/1989 | |
| JP | 2-214864 A | 8/1990 | |
| JP | 3-163819 A | 7/1991 | |
| JP | 4-162711 A | 6/1992 | |
| JP | 6-236871 A | 8/1994 | |
| JP | 7-135171 A | 5/1995 | |
| JP | 10-50595 | 2/1998 | |
| JP | 10-92802 | 4/1998 | |
| JP | 2001-307991 | 11/2001 | |
| JP | 2002-313709 A | 10/2002 | |
| JP | 2003-17402 A | 1/2003 | |
| JP | 2003-158054 | 5/2003 | |
| JP | 2003-209036 | 7/2003 | |
| JP | 2004-186419 A | 7/2004 | |
| JP | 2006-223988 | 8/2006 | |
| JP | 2008-60462 A | 3/2008 | |
| JP | 2008-172104 | 7/2008 | |

OTHER PUBLICATIONS

Korean Office Action issued Apr. 18, 2012 in patent application No. 10-2011-7005947 with partial English translation.

Japanese International Search Repot mailed Feb. 16, 2010 in PCT/JP2009/068912 filed Nov. 5, 2009 (with English Translation).

Japanese Written Opinion mailed Feb. 16, 2010 in PCT/JP2009/068912 filed Nov. 5, 2009.

Japanese Office Action issued Jun. 19, 2012 in Patent Application No. 2010-536787 with English Translation.

* cited by examiner

VERY LOW VISCOSITY

HIGH VISCOSITY    LOW VISCOSITY

FILM FORMING APPARATUS, FILM FORMING METHOD, AND SEMICONDUCTOR DEVICE

CROSS-REFERENCE TO RELATED APPLICATIONS

This application is based upon and claims the benefit of priority from Japanese Patent Application No. 2008-284652, filed Nov. 5, 2008, and International Application No. PCT/JP2009/068912, filed Nov. 5, 2009; the entire contents of all of which are incorporated herein by reference.

FIELD

Embodiments described herein relate generally to a film forming apparatus, a film forming method, and a semiconductor device.

BACKGROUND

Film forming apparatuses are used at liquid-phase film forming processes for manufacturing semiconductor devices, liquid crystal displays, and the like. In the liquid-phase film forming processes, the coating films formed on substrates such as wafers are required to have uniform film thicknesses of about 0.1 to 1.0 μm. The coating films are therefore usually formed by spin coating. The spin coating is a coating method of forming a coating film on a substrate by supplying a material to the center of the substrate and rotating the substrate at high speed to spread the material on the substrate surface.

DETAILED DESCRIPTION

According one embodiment, a film forming apparatus includes a stage, a coating section, a vapor supply section, a blower section, and a controller. On the stage, an coating target is placed. The coating section applies a material to a predetermined region on the coating target placed on the stage to form a coating film. The vapor supply section generates solvent vapor capable of dissolving the coating film. The blower section blows the solvent vapor generated by the vapor supply section onto the coating film on the coating target placed on the stage. The controller controls an amount of the solvent vapor to be blown by the blower section so that: the coating film is dissolved; viscosity in a part of the coating film on a surface layer side is lower than that in a part thereof on the coating target side; and the viscosity in the part on the surface layer side and the viscosity of the coating target side take such values that prevent the coating film on the coating target from spreading.

Various Embodiments will be described hereinafter with reference to the accompanying drawings.

(First Embodiment)

A description will be given of a first embodiment with reference to FIGS. 1 to 13.

Figure 1:
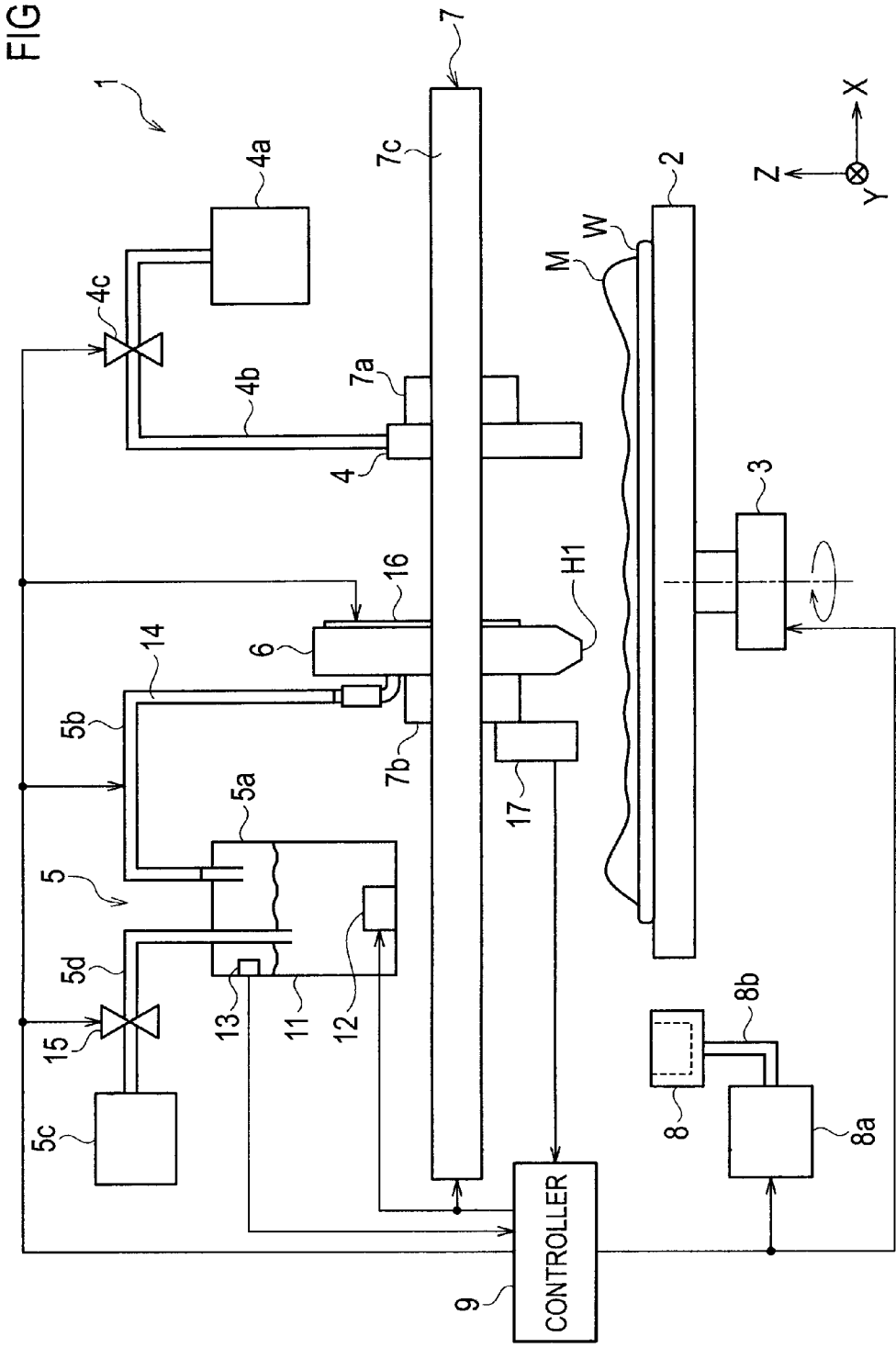
FIG. 1 is a schematic view illustrating a schematic configuration of a film forming apparatus according to a first embodiment.

As illustrated in FIG. 1, a film forming apparatus 1 according to the first embodiment includes a stage 2, a rogation mechanism 3, an coating section 4, a vapor supply section 5, a blower section 6, a movement mechanism 7, and an exhaust section 8, and a controller 9. On the stage 2, a wafer W as a coating target is placed. The rotation mechanism 3 rotates the stage 2 in a horizontal plane. The coating section 4 applies a material to the wafer W placed on the stage 2 to form a coating film M. The vapor supply section 5 generates solvent vapor (vaporized solvent) capable of dissolving the coating film M. The blower section 6 blows out the solvent vapor on the coating film M formed on the wafer W. The coating section 4 and the blower section 6 is relatively moved to the wafer W on the stage 2 by the movement mechanism 7. The exhaust section 8 exhausts the solvent vapor. The controller 9 controls each section.

The stage 2 is circular and can be rotated in a horizontal plane by the rotation mechanism 3. The stage 2 includes a attraction mechanism attracting the wafer W placed thereon. The attraction mechanism fixes and holds the wafer W on the upper surface of the stage 2. Examples of the attraction mechanism include an air suction mechanism. The stage 2 further includes a plurality of supporting pins which are capable of protruding and retracting and support the wafer W. The wafer W is supported by the supporting pins when the wafer W is transferred by a transportation robot arm or the like.

The rotation mechanism 3 supports the stage 2 so as to rotate the same in a horizontal plane and is a mechanism rotating the stage 2 around the center of the stage 2 in a horizontal plane by a driving source such as a motor. The wafer W placed on the stage 2 is thus rotated within the horizontal plane.

The coating section 4 is a coating nozzle discharging the material forming the coating film M. The coating section 4 continuously discharges the material from the tip thereof at a predetermined pressure to apply the material to the wafer W placed on the stage 2. The coating section 4 is connected to a tank 4a reserving the material through a supply line 4b such as a tube or a pipe. The supply line 4b is provided with a regulation valve 4c. The regulation valve 4c is electrically connected to the controller 9 and regulates the amount of the material to be discharged from the coating section 4 according to control by the controller 9.

The vapor supply section 5 includes a solvent vapor generation unit 5a, a transport line 5b, a carrier gas supply unit 5c, and a supply line 5d. The solvent vapor generation section 5a generates solvent vapor. The transport line 5b allows the solvent vapor generation unit 5a to communicate with the blower section 6. The carrier gas supply unit 5c supplies carrier gas to the solvent vapor generation unit 5a. The carrier gas is configured to transport the generated solvent vapor to the blower section 6 through the transport line 5b. The supply line 5d allows the solvent vapor generation unit 5a to communicate with the carrier gas supply unit 5c.

The solvent vapor generation unit 5a includes: a tank 11 reserving the solvent; a heater 12 for generating the solvent vapor, and a temperature sensor 13 measuring temperature of the solvent vapor in the tank 11. The heater 12 and the temperature sensor 13 are electrically connected to the controller 9, and the controller 9 adjusts the temperature of the heater 12 based on the temperature measured by the temperature sensor 13 so that the solvent in the tank 11 is vaporized.

The transport line 5b is a transport channel which connects the solvent vapor generation unit 5a to the blower section 6 and transports the solvent vapor from the solvent vapor generation unit 5a to the blower section 6. Examples of the transport line 5b are tubes and pipes. The transport line 5b is provided with a heater 14 supplying heat. The heater 14 is a sheet-formed heater and is wrapped around the outer surface of the transport line 5b. The heater 14 is electrically connected to the controller 9 and is adjusted by the controller 9 so that the temperature of the transport line 5b is higher than the dew-point temperature of the solvent.

Herein, when the temperature of the transport line 5b is lower than the dew-point temperature of the solvent, the vaporized solvent in the carrier gas is condensed, making it difficult to obtain a desired amount of solvent vapor. The temperature of the transport line 5b is adjusted by the heater 14 to be maintained in such a temperature range that the solvent vapor in the transport line 5b will not be condensed.

The carrier gas supply unit 5c is a supply unit which reserves the carrier gas and supplies the same to the solvent vapor generation unit 5a. The solvent vapor generated in the solvent vapor generation unit 5a is transported to the blower section 6 with the carrier gas to be blown out. Examples of the carrier gas are air and inert gases such as nitrogen.

The supply line 5d is a supply channel connecting the carrier gas supply unit 5c and the solvent vapor generation unit 5a to supply the carrier gas from the carrier gas supply unit 5c to the solvent vapor generation unit 5a. Examples of the supply line 5d are tubes and pipes. The supply line 5d is provided with a regulation valve 15 to regulate the flow rate of the carrier gas. The regulation valve 15 is electrically connected to the controller 9 and regulates the flow rate of the carrier gas from the carrier gas supply unit 5c according to control by the controller 9.

The blower section 6 is a blower head blowing the solvent vapor transported from the solvent vapor generation unit 5a through the transport line 5b, which is an air knife type gas supply unit. The blower section 6 is formed in a box and includes a slit-shaped (thin gap) supply outlet H1. On the side surface of the blower section 6, a heater 16 supplying heat is provided. The heater 16 is a sheet-shaped heater and is attached to the outer surface of the blower section 6. The heater 16 is electrically connected to the controller 9 and is adjusted by the controller 9 so that the temperature of the blower section 6 is higher than the dew-point temperature of the solvent.

Herein, similarly to the above-described transport line 5b, when the temperature of the blower section 6 is lower than the dew-point temperature of the solvent, the vaporized solvent in the carrier gas is condensed, making it difficult to obtain a desired amount of solvent vapor. The temperature of the blower section 6 is therefore adjusted by the heater 16 to be maintained within such a temperature range that the solvent vapor in the transport line 5b will not be condensed.

Figure 2:
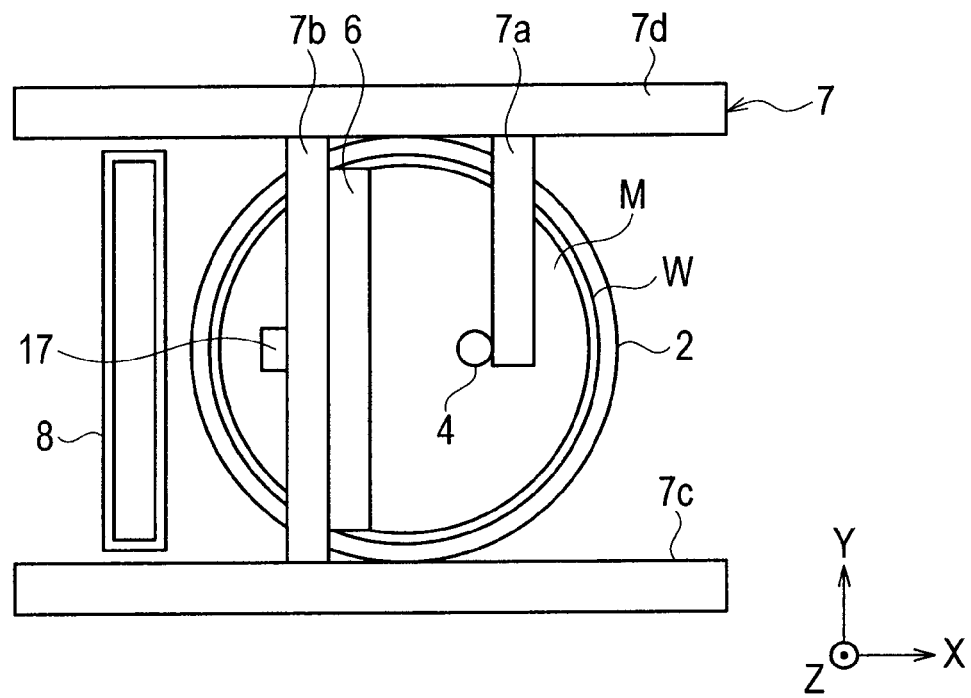
FIG. 2 is a plan view illustrating the schematic configuration of the film forming apparatus illustrated in FIG. 1.

As illustrated in FIGS. 1 and 2, the movement mechanism 7 includes a first Z-axis movement mechanism 7a, a second Z-axis movement mechanism 7b, a first X-axis movement mechanism 7c, and a second X-axis movement mechanism 7d. The first Z-axis movement mechanism 7a supports the coating section 4 and moves the same in the Z-axis direction. The second Z-axis movement mechanism 7b supports the blower section 6 and moves the same in the Z-axis direction. A pair of the first X-axis movement mechanism 7c and the second X-axis movement mechanism 7d moves the first Z-axis movement mechanism 7a and the second Z-axis movement mechanism 7b in the X-axis direction, respectively. Examples of each of the Z-axis and X-axis movement mechanisms 7a, 7b, 7c, and 7d includes a linear motor movement mechanism using a linear motor as a driving source and a feeding screw movement mechanism using a motor as a driving source.

The pair of the first and the second X-axis movement mechanisms 7c and 7d are movement mechanisms individually moving the coating section 4 and the blower section 6 in the X-axis direction through the first and the second Z-axis movement mechanisms 7a and 7b, respectively. For example, the coating section 4 is moved by the first X-axis movement mechanism 7d from the center of the stage 2 toward the outer periphery in the X-axis direction. The blower section 6 is moved by the pair of the first and the second X-axis movement mechanisms 7c and 7d over the entire surface of the stage 2 in the X-axis direction.

The second Z-axis movement mechanism 7b is provided with a height sensor 17 composed of a reflective laser distance sensor or the like. The height sensor 17 is moved in the X-axis direction together with the second Z-axis movement mechanism 7b by the pair of the first and the second X-axis movement mechanisms 7c and 7d to measure waviness, surface roughness, and the like of the coating surface of the wafer W. This provides a height profile of the coating surface of the wafer W.

The exhaust section 8 is an exhaust head exhausting the solvent vapor blown from the blower section 6 which is held at a stand-by position not facing the stage 2. The exhaust section 8 continuously sucks the solvent vapor by a predetermined suction force and exhausts the same. The exhaust section 8 is connected to a pump 8a through a discharge line 8b composed of a tube, a pipe, or the like. The pump 8 generates the predetermined suction force. The pump 8a is electrically connected to the controller 9 and driven according to control by the controller 9.

The controller 9 includes a microcomputer integratedly controlling each section and a storage device storing various types of programs and information and the like. The storage device is a memory, a hard disk drive (HDD), or the like. The controller 9 controls rotation of the stage 2, movement of the coating section 4, movement of the blower section 6, and the like based on the various types of programs. This can variously changes the positions of the coating section 4 and the blower section 6 relative to the wafer W on the stage 2.

Next, a description will be given of the film forming process (film forming method) performed by the film forming apparatus 1. The controller 9 of the film forming apparatus 1 executes the film forming process based on the various types of programs. The film forming process is performed with the wafer W attracted and fixed on the stage 2.

Figure 3:
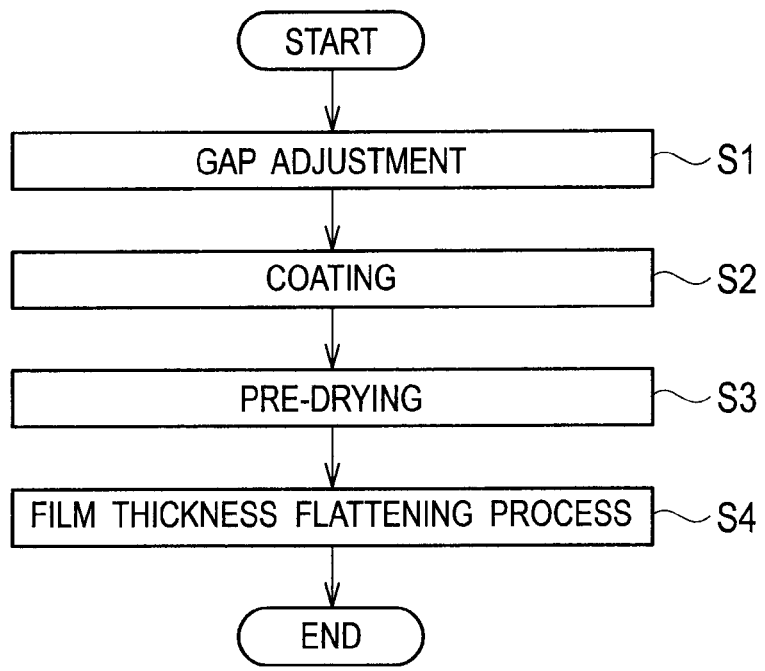
FIG. 3 is a flowchart illustrating a flow of a film forming process performed by the film forming apparatus illustrated in FIGS. 1 and 2.

As illustrated in FIG. 3, first, gap adjustment is performed (step S1), and next, coating by the coating section 4 is performed (step S2). Subsequently, pre-drying is performed (step S3), and the film thickness flattening process by the blower section 6 is performed (step S4). The film forming process is thus completed.

At the gap adjustment in the step S1, the height sensor 17 is moved in the X-axis direction together with the second Z-axis movement mechanism 7b by the pair of the first and the second X-axis movement mechanisms 7c and 7d and measures the waviness, surface roughness, and the like of the wafer W on the stage 2. The height profile is thus obtained and stored in the storage device of the controller 9. Next, for the purpose of setting the vertical distance between the coating section 4 and the coating surface of the wafer W (hereinafter, just referred to as the gap) equal to the setting value, a correction value is obtained using the above height profile to calculate the difference between the average of height and the setting value, for example. The coating section 4 is move by the correction value in the Z-axis direction by the Z-axis movement mechanism 7a. The gap between the coating section 4 and the coating surface of the wafer W is adjusted to the desired gap. If variations in gaps of wafers W are small, the adjustment of the gap is performed at the first time and is omitted thereafter.

Figure 4:
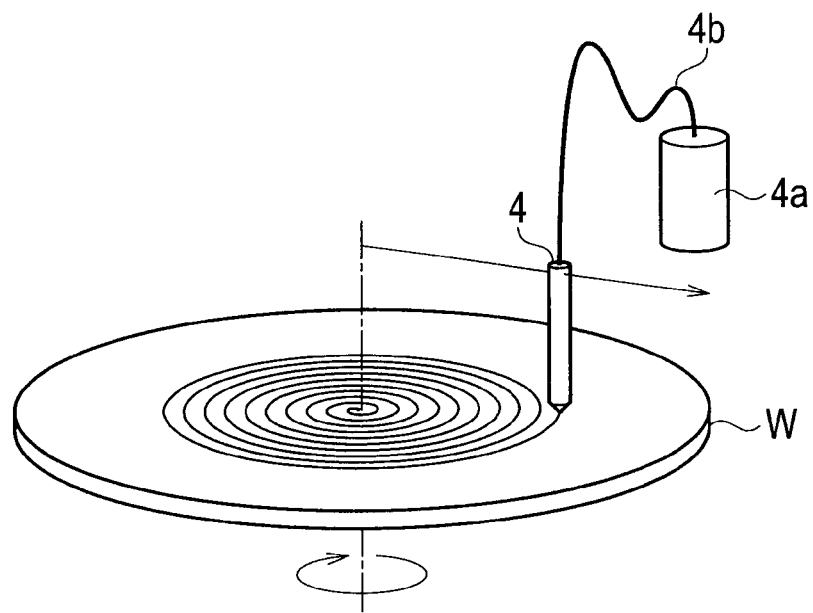
FIG. 4 is an explanatory view for explaining coating by the film forming apparatus at the film forming process illustrated in FIG. 3.

At the coating of the step S2, as shown in FIG. 4, the stage 2 is rotated by the rotation mechanism 3 while the coating section 4 is gradually moved together with the Z-axis movement mechanism 7a by the X-axis movement mechanism 7d in the X-axis direction, from the center of the wafer W toward the outer periphery. At this time, the coating section 4 continuously discharges the material onto the coating surface of the wafer W while moving. The discharge rate of the material is controlled according to the circumferential speed so that the material is applied in a spiral pattern on the coating surface (spiral coating). The coating film M is thus formed on the coating surface of the wafer W.

Figure 5:
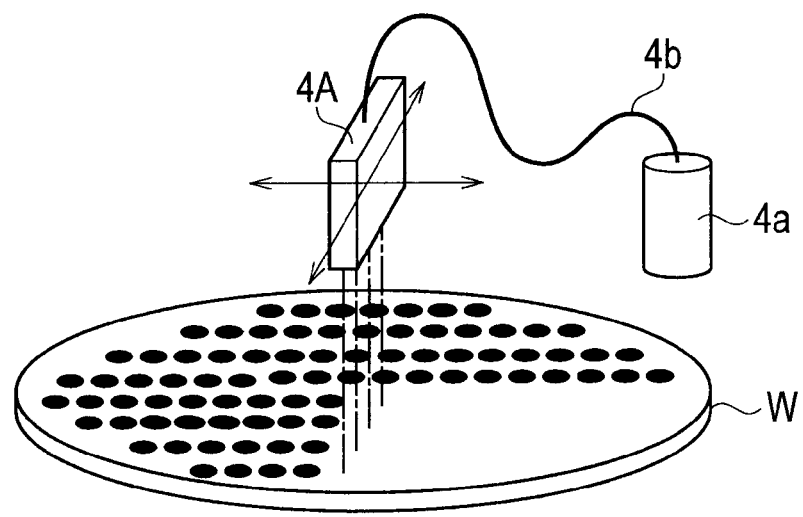
FIG. 5 is an explanatory view for explaining a modification of the coating illustrated in FIG. 4.

The coating section 4 is a coating nozzle but is not limited to this. As illustrated in FIG. 5, the coating section 4 may be a jet head 4A such as an ink jet head jetting the material in the form of a plurality of droplets, for example. The jet head 4A is formed so as to move in the Y-axis direction in addition to the X-axis direction. The position of the jet head 4A relative to the wafer W changes while the plurality of droplets are jetted from the jet head 4A to be applied on the coating surface of the wafer W (dot coating). The amount of jetted material, application pitches, and the amount of droplets at this time are optimized to connect the droplets on the wafer W, thus forming the coating film M of the material on the coating surface of the wafer W. In the case of using the jet head 4A such as the ink jet head, the coating can be efficiently performed by jetting the material while rotating the stage 2 by the rotation mechanism 1

At the pre-drying in the step S3, in order to reduce the fluidity of the coating film M on the wafer W, drying of the coaling film M is promoted by rotating the stage 2 at a predetermined speed for a predetermined time. The coating film M is promoted drying especially in the outer periphery, thus preventing the coating film M from spreading. When the fluidity of the coating film M is not a problem, the pre-drying can be omitted. When such pre-drying is provided after the material is applied to the wafer W, the coating film M is dried to a certain degree at the drying process to reduce the fluidity of the coating film M. It is therefore possible to reduce a change in film shape caused at a peripheral edge of the coating film M in the Elm thickness flattening process performed thereafter.

Figure 6:
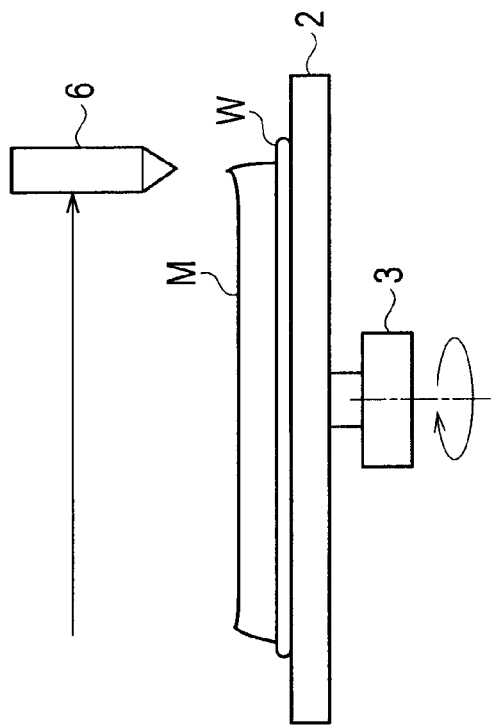
FIG. 6 is an explanatory view for explaining a film thickness flattening process at the filth forming process.
Figure 6:
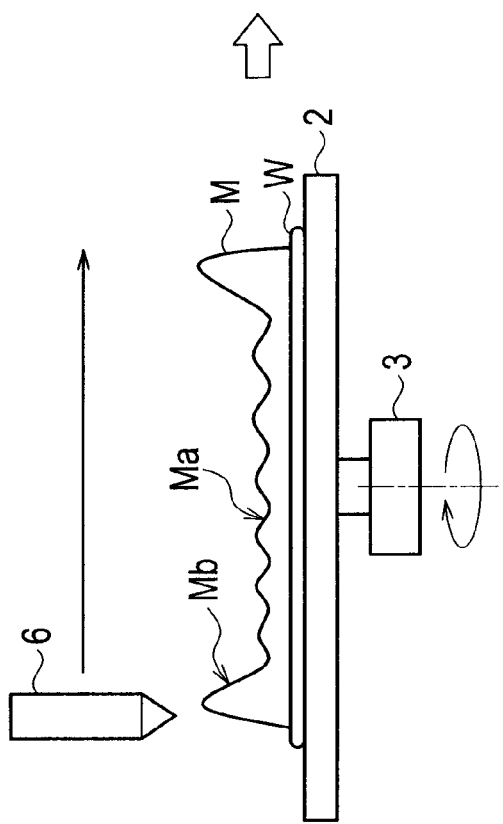

At the film thickness flattening process in the step S4, as illustrated in FIG. 6, the blower section 6 is moved in the X-axis direction over the entire surface of the wafer W together with the second Z-axis movement mechanism 7b by the pair of the first and the second X-axis movement mechanisms 7c and 7d. At this time, the blower section 6 moves in the X-axis direction while continuously blowing the solvent vapor onto the coating film M on the wafer W to dissolve the surface layer of the coating film M. The controller 9 controls the rate of solvent vapor to be blown (the supply of solvent vapor) so that the viscosity of the surface layer of the coating film M is lowered. The rate of solvent vapor to be blown is adjusted by regulating the flow rate of the carrier gas by the regulation valve 15, changing the temperature setting of the solvent vapor generation unit 5a, or performing the both. Moreover, the rate of solvent to be blown can be adjusted by controlling the rotation speed of the rotation mechanism 3 by the controller 9. In the coating film M, the viscosity is lowered not only in the surface layer also can be reduced around the surface layer or only in the surface layer. Moreover, the viscosity of the coating film M on the wafer W side (the stage side) is controlled so as not to be lower than that on the surface layer side.

Before the above-described film thickness flattening process, the coating film M includes coating pitch unevenness Ma due to the spiral coating or the dot coating and a crown Mb caused at drying. In the film thickness flattening process, when the solvent vapor is blown onto the wafer W by the blower section 6, the viscosity of the surface layer of the coating film M is lowered, and the coating pitch unevenness Ma and the crown Mb are reduced to be small, thus resulting in small variations in the coating film M. The film thickness uniformity is degraded due to the spiral or the dot coating. However, the film thickness flattening process reduces the variation in the coating film M, thus making it possible to provide film thickness uniformity equal to or greater than that by spin coating.

Accordingly, it is possible to use a coating method other than the spin coating such as the spiral coating and the dot coating. Compared to the spin coating, by using such a coating method, the material can be applied only in a predetermined region of the coating surface of the wafer W. This prevents the material scattered or turned into mist from sticking to the side and rear surfaces of the wafer W. Furthermore, this eliminates the need for the processes called edge cut and back rinse after the coating process and also eliminates the need for regular replacement of a cup. As described above, it is possible to achieve an increase in material use efficiency, reduction in burden on the environments, and prevention of the reduction in availability while maintaining the film thickness uniformity.

Figure 7:
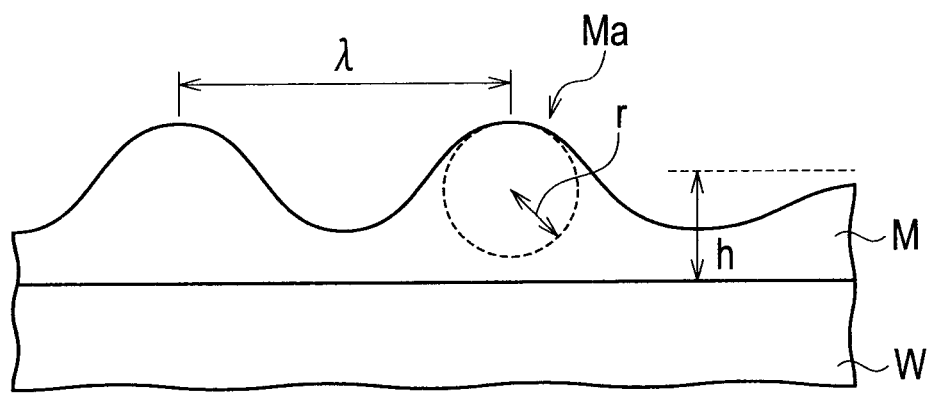
FIG. 7 is an explanatory view for explaining a flattening phenomenon at the film thickness flattening process illustrated in FIG. 6.

Herein, as illustrated in FIG. 7, in the presence of the coating pitch unevenness Ma, flattening time T has a relation of T ($\mu\lambda^4/\sigma h^3$ ($\mu$: viscosity, $\lambda$: wavelength, $\sigma$: surface tension, h: average thickness) and is proportional to the viscosity $\mu$ of the material. Accordingly, if the solvent vapor is blown onto the surface of the coating film M to dissolve the surface layer of the coating film M and lower the viscosity, the flattening time T is shortened, and the flattening of the coating film M is promoted. Even when the surface tension a of the coating material is high, blowing the solvent vapor onto the surface of the coating film M can lower the viscosity at the surface and promote the flattening of the coating film M.

In the case of performing the aforementioned film thickness flattening process, while the blower section 6 and the wafer W are relatively moved in a straight manner by the pair of the first and the second X-axis movement mechanisms 7c and 7d, the stage 2 may be controlled to rotate. In such a case, the surface layer of the coating film M with the viscosity lowered is easily flattened due to the centrifugal force. The flattening time is shortened, and the flattening effect can be promoted.

Herein, the blower section 6 stands by at the stand-by position not facing the stage 2 when the aforementioned film thickness flattening process is not in execution. The solvent vapor blown out from the blower section 6 standing by at the stand-by position is exhausted by the exhaust section 8. Herein, the blower section 6 is controlled so as to always blow out the solvent vapor. Such control of always flowing the solvent vapor to each section can stabilize the temperature of the solvent vapor and the rate of solvent vapor.

Herein, the film thickness flattening process of the step S4 will be described in detail using FIGS. 8 to 12. The coating film M desirably has a thin columnar shape after being subjected to flattening with the solvent vapor supplied and the later-described drying (baking).

Figure 8:
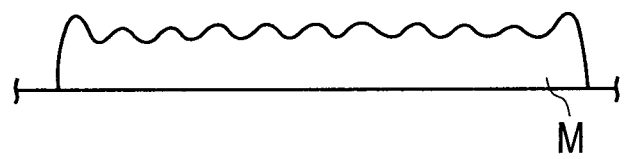
FIG. 8 is an explanatory view for explaining a liquid film (a coating film) after the coating.
Figure 9:
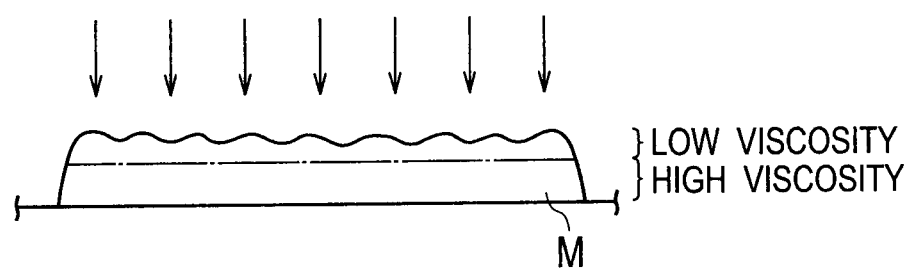
FIG. 9 is an explanatory view for explaining the liquid film already subjected to the film thickness flattening process.
Figure 10:
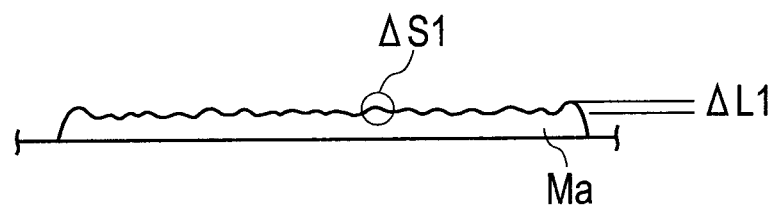
FIG. 10 is an explanatory view for explaining a dried film obtained by performing a drying process (a baking process) for the liquid film illustrated in FIG. 9.

First, the coating section 4 continuously discharges the material on the coating surface of the wafer W while moving for coating in a spiral pattern on the coating surface (the spiral coating). The liquid film at this time is illustrated in FIG. 8. Next, the liquid film subjected to the film thickness flattening process is illustrated in FIG. 9. Herein, the viscosity of the surface layer of the liquid film is lowered by the solvent vapor, thus reducing the surface unevenness formed at coating. FIG. 10 illustrates a dried film Ma obtained by drying (baking) such a liquid film illustrated in FIG. 9. Herein, the liquid flows to the peripheral edge during the drying to generate a protrusion $\Delta L1$ (a so-called crown) at the peripheral edge. On the other hand, in the part other than the peripheral edge (inside the peripheral edge), there is a variation $\Delta S1$ in film thickness due to the unevenness formed at the coating. Herein, $\Delta L1$ refers to a distance between the average thickness and the highest point of the protrusion, and $\Delta S1$ refers to a range of the unevenness other than the peripheral edge (inside the peripheral edge).

FIG. 9 is a view explaining the outline of the distribution of viscosity and simplistically illustrates a part with low viscosity and a part with high viscosity.

Herein, the surface layer refers to a layer in the surface and intends a part with the unevenness. It is at least necessary to lower the viscosity of the surface layer.

Figure 11:
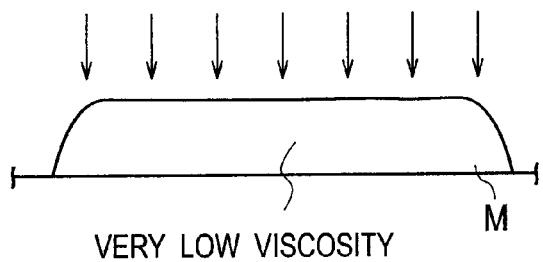
FIG. 11 is an explanatory view for explaining the liquid film subjected to the film thickness flattening process with solvent vapor increased.
Figure 12:
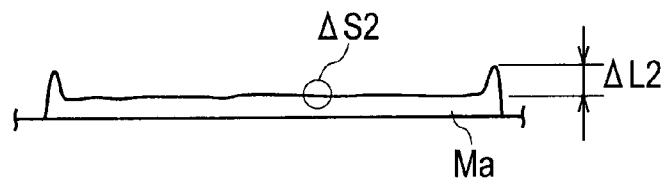
FIG. 12 is an explanatory view for explaining a dried film obtained by performing the drying process for the liquid film illustrated in FIG. 11.

Generally, $\Delta L1$ and $\Delta S1$ have a tradeoff relation. Specifically, in order to further improve the flatness other than the peripheral edge (inside the peripheral edge), the amount of solvent vapor should be increased as a whole. However, if the amount of solvent vapor is increased, the height of the protrusion of the peripheral edge is increased. As illustrated in FIG. 11, the viscosity of the liquid film is significantly lowered to very low viscosity, and the peripheral edge is rounded and gradually changes in shape although the part other than the peripheral edge (inside the peripheral edge) has good flatness. If the liquid film is subjected to drying (baking), solid contents flow to the peripheral edge and dry because of the good fluidity of the liquid. This results in a dried film Ma with a high protrusion at the peripheral edge as illustrated in FIG. 12 ($\Delta S2 < \Delta S1$, $\Delta L2 > \Delta L1$).

The peripheral edge refers to a part where the change in film shape caused at drying of the coating film M of the wafer M appears. The peripheral edge is defined by seeing the part where $\Delta L1$ is generated from above.

The width of the part where $\Delta L1$ to $\Delta L3$ are generated is about 2 nm from the edge of the coating film M and vary on the coating material, solvent, or the like.

Accordingly, if the amount of solvent vapor is increased to lower the viscosity of the coating film M on the wafer W side (the stage side), the height of the protrusion of the peripheral edge is increased, and the coating film M cannot be flattened.

The rate (the supply) of solvent vapor to be blown is controlled so as to lower the viscosity of the surface layer of the coating film M.

Herein, it is important to change the distribution of viscosity of the coating film M. For example, the protrusion of the periphery can be prevented from increasing in height by controlling the viscosity of the coating film M so that the viscosity is not lower on the wafer W side (the stage side) than that on the surface layer side. It is possible to reduce the height of the protrusion and achieve flattening by maintaining the viscosity of the coating film M as far as possible on the wafer W side (the stage side) while reducing the viscosity on the surface layer side.

As described above, the rate of solvent vapor to be blown is adjusted by regulating the flow rate of the carrier gas by the regulation valve 15, changing the temperature setting of the solvent vapor generation unit 5a, or performing the both. The rate of solvent vapor to be blown can be also adjusted by controlling the rotation speed of the rotation mechanism 3 by the controller 9.

In the case where the solvent vapor is blown on the coating film M to lower the viscosity of the coating film M on the surface layer side, the protrusion of the peripheral edge can be prevented from increasing in height by reducing the viscosity in 60% of the thickness of the coating film M from the surface. Most preferably, the viscosity thereof is lowered in 30% of the thickness of the coating film M from the surface.

Furthermore, the change in film shape caused in the wafer W can be prevented by blowing the solvent vapor on the coating film M to change the viscosity distribution of the coating film M on the wafer W. For example, the change in film shape caused in the peripheral edge of the wafer W can be prevented by reducing the viscosity of the coating film M other than the peripheral edge thereof (inside the peripheral edge).

In order to lower the viscosity of the coating film M other than the periphery (within the periphery), the controller 9 performs control to blow the solvent vapor only in a predetermined region.

Moreover, use of the spiral coating by the coating section has an advantage in flattening compared to the other coating methods. Specifically, the uneven pattern of the film surface due to the spiral coating is approximately symmetric in the rotation direction (the amplitude and pitch of the unevenness are constant at any radial cross-section). Accordingly, the entire surface of the coating film M on the wafer W by the spiral coating can be made more uniform than that by the other coating methods even under the same conditions of the film thickness flattening process.

When the material is applied by a dispenser or the like with a single stroke in a straight manner, the unevenness pattern is not symmetric in the rotation direction. In order to equalize the entire surface of the coating film M on the wafer W, it is necessary to locally change the conditions including the supply of the solvent and the like. Accordingly, use of the spiral coating can enhance the flattening effect and provide a film thickness uniformity equal to that by the spin coating.

As described above, according to the first embodiment, the solvent vapor is generated and blown on the coating film M on the wafer W. This can lower the viscosity of the surface layer of the coating film M and reduce the coating pitch unevenness Ma and the crown Mb due to the spiral coating or the dot coating, thus resulting in small variations in the coating film M. Accordingly, even in the case of using a coating method other than the spin coating, such as the spiral coating or the dot coating, the film thickness uniformity can be maintained. It is therefore possible to use the coating method such as the spiral coating or the dot coating. In the case of using the spiral coating or the dot coating, compared to the spin coating, the material can be applied to only a predetermined region of the coating surface of the wafer W. This prevents the material scattering or turned into mist from sticking to the side or rear surface of the wafer W, thus eliminating the need for the processes called the edge cut and the back rinse after the coating process. Moreover, there is no need to regularly replace the cup. It is therefore possible to achieve an increase in material use efficiency, reduction in burden on the environment, and prevention of reduction in availability while maintaining the film thickness uniformity.

The amount of solvent vapor to be blown is adjusted so that the viscosity of the surface layer of the coating film M is lowered. Accordingly, the viscosity of the surface layer of the coating film M is lowered, and the drying time taken to dry the coating film M can be shortened. The manufacturing time can be therefore shortened.

Moreover, the viscosity of the coating film M on the wafer W side (the stage side) is controlled so as not to be lower than the viscosity thereof on the surface layer side. This can prevent the protrusion of the peripheral edge from increasing in height.

Furthermore, the solvent vapor is blown on the coating film M to change the viscosity distribution of the coating film M on the wafer W. This can prevent the change in film shape caused in the wafer W. For example, by reducing the viscosity other than the peripheral edge (inside the peripheral edge), the change in film shape caused at the periphery of the wafer W can be prevented.

In order to lower the viscosity of the coating film M other then the peripheral edge (inside the peripheral edge), the controller 9 performs a control to blow the solvent vapor only in the predetermined region.

Moreover, the solvent vapor is blown on the coating film M on the wafer W while the wafer W is rotated within the horizontal plane. In addition to lowering in viscosity due to the solvent vapor, the variations in the coating film M can be further lowered by the centrifugal force due to the rotation, thus improving the film thickness uniformity of the coating film M.

Furthermore, the coating film M on the wafer W is dried by the pre-drying. The coating film M is therefore dried to a certain degree at the pre-drying process and is reduced in fluidity. This can prevent the change in film shape caused at the peripheral edge of the wafer W at the film thickness flattening process performed later.

Herein, a drying means in the aforementioned pre-drying is rotation of the wafer W with the rotation mechanism 3 as a drying section but not limited to this. For example, it is possible to blow drying gas such as nitrogen on the wafer W with a blowing mechanism, heat the wafer W with a baking furnace, provide a heating means for the stage 2 to heat the wafer W, or provide an air supply head or lump for drying at an equal distance from the coating section 4 and the rotation axis of the stage 2.

Figure 13:
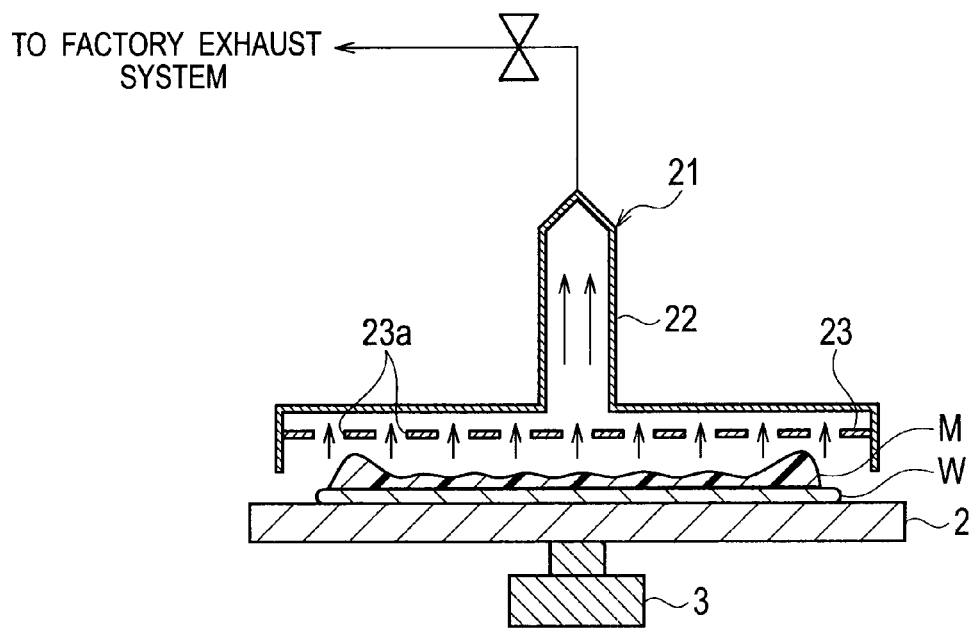
FIG. 13 is an explanatory view for explaining an exhaust unit used for pre-drying at the film forming process illustrated in FIG. 3.

Moreover, as illustrated in FIG. 13, it is possible to use an exhaust unit 21 capable of performing uniform exhaust. The exhaust unit 21 includes a casing 22 covering the stage 2 and a dispersion plate 23 provided in the casing 22. The dispersion plate 23 is provided a plurality of through-holes 23a allowing air to pass therethrough to equalize the exhaust gas. An upper part of the casing 22 is connected to a factory exhaust system, and air flows from a bottom part of the casing 2 upward through the dispersion plate 23. The air is exhausted from the upper part of the casing 22. The coating film M on the wafer W can be thus uniformly dried.

(Second Embodiment)

A description will be given of a second embodiment with reference to FIGS. 14 to 16.

The second embodiment is a modification of the first embodiment. The description will be given of a part different from the first embodiment, that is, the blower section 6. In the second embodiment, the description of the same part as described in the first embodiment will be omitted.

Figure 14:
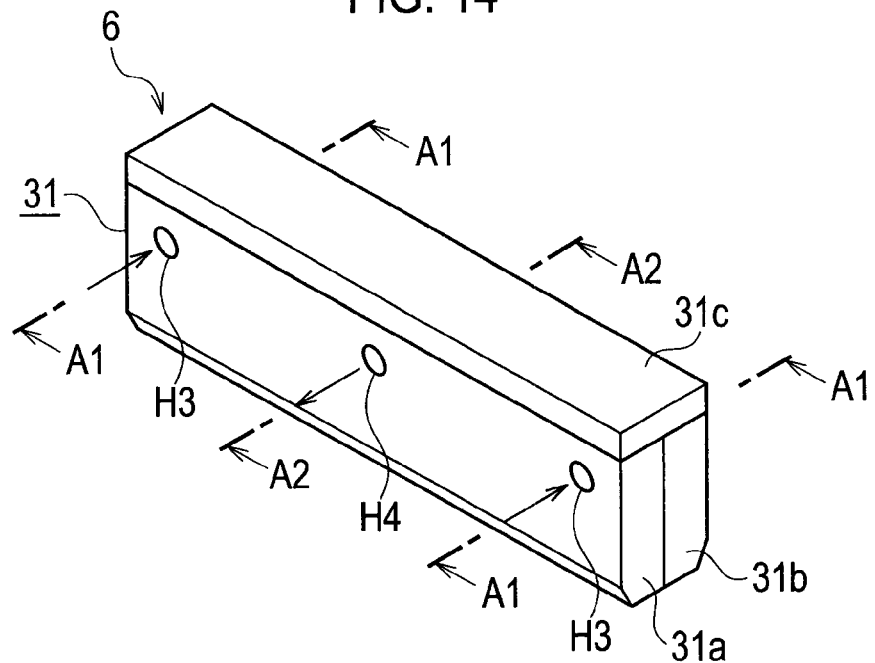
FIG. 14 is an exterior perspective view illustrating a schematic configuration of a blower section provided for a film forming apparatus according to a second embodiment.
Figure 15:
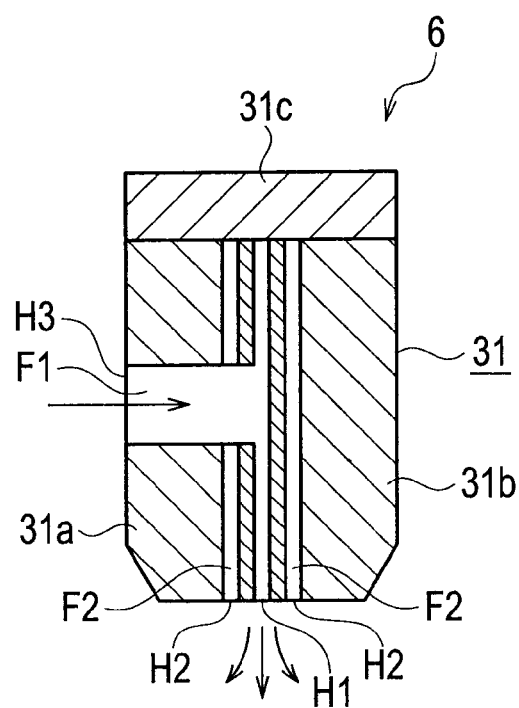
FIG. 15 is a cross-sectional view taken along a line A1-A1 of FIG. 14.
Figure 16:
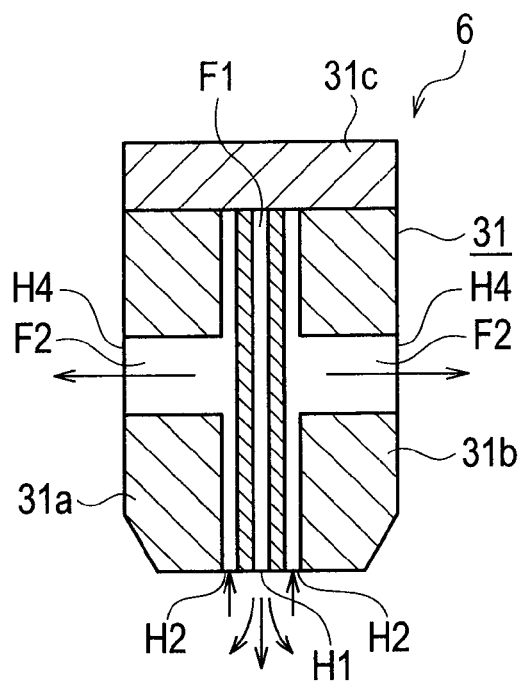
FIG. 16 is a cross-sectional view taken along a line A2-A2 of FIG. 14.

As illustrated in FIGS. 14 to 16, the blower section 6 according to the second embodiment is an air knife type supply and exhaust unit. The blower section 6 includes a rectangular cuboid shaped casing 31, a supply outlet H1 blowing the solvent vapor supplied from the air supply section 5, and an exhaust inlet H2 which is provided around the supply outlet H1 and exhausts surplus of the solvent vapor blown from the supply outlet H1.

The casing 31 includes three block bodies 31a, 31b, and 31c assembled to form a rectangular cuboid. The block bodies 31a to 31c are fixed to each other by fastening members such as bolts.

The supply outlet H1 is slit-shaped and formed in a bottom surface of the casing 31 (FIGS. 15 and 16). The supply outlet H1 is connected to two supply inlets H3 through a supply channel F1. Bach of the supply inlets H3 is circular and formed in the side surface of the casing 31. The supply channel F1 is a channel which has a slit shape elongated in a direction vertical to the direction that the solvent vapor flows and allows the supply outlet H1 to communicate with the two supply inlets H3. These supply inlets H3 are connected to the transport line 5b.

The two exhaust inlets H2 are slit-shaped and formed close to the supply outlet H1 with the supply outlet H1 interposed therebetween in the bottom surface of the casing 31 (in FIGS. 15 and 16). The exhaust inlets H2 are connected to two exhaust outlets H4 through exhaust channels F2. The exhaust outlets H4 are circular and are formed in the side surfaces of the casing 31. The two exhaust channels F2 are slit-shaped and are formed with the supply channel F1 interposed therebetween. The two exhaust channels F2 are channels allowing the exhaust inlets H2 to communicate with the respective exhaust outlets H4.

The blower section 6 includes a supply function to blow and supply the solvent vapor and an exhaust function to exhaust the surplus of the solvent vapor. The blower section 6 has an integrated structure of the supply and the exhaust functions. The optimized balance between gas supply and exhaust prevents the surplus of the solvent vapor from scattering within the apparatus when the solvent vapor is supplied to the costing film M, thus preventing contamination of the apparatus.

Moreover, the surplus of the solvent vapor is exhausted. Accordingly, the viscosity distribution of the coating film M can be properly controlled.

As described above, according to the second embodiment, it is possible to provide the same effects as those of the first embodiment Moreover, the provision of the exhaust inlets H2 close to the supply outlet H1 supplying the solvent vapor facilitates the optimization of the amounts of solvent vapor supplied and exhausted. This allows the solvent vapor to be supplied only to a narrow range just under the supply outlet H1. Accordingly, the surplus of the solvent vapor will not scatter within the apparatus, thus preventing contamination of the apparatus.

Furthermore, exhaust of the surplus of the solvent vapor allows proper control of the viscosity distribution of the coating film M.

Still furthermore, by exhaust of the surplus of the solvent vapor, the viscosity of the coating film M on the wafer W side (the stage side) can be controlled so as not to be lower than that on the surface layer. This can prevent the protrusion of the peripheral edge from increasing in height. Moreover, by maintaining the viscosity of the coating film M as far as possible on the wafer W side (the stage side) while lowering the viscosity on the surface layer side, the height of the protrusion can be reduced, thus flattening the coating film M.

(Third Embodiment)

A description will be given of a third embodiment with reference to FIGS. 17 and 18.

The third embodiment is a modification of the first embodiment. The description will be given of a part different from the first embodiment, that is, the blower section 6. In the third embodiment, the description of the same part as described in the first embodiment will be omitted.

Figure 17:
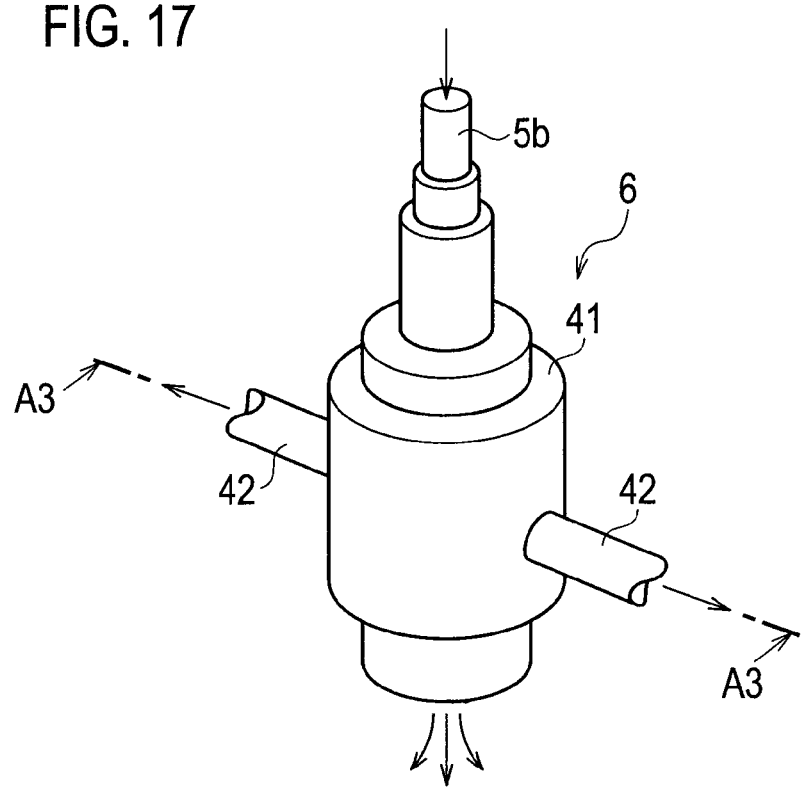
FIG. 17 is an exterior perspective view illustrating a schematic configuration of a blower section provided for a film forming apparatus according to a third embodiment.
Figure 18:
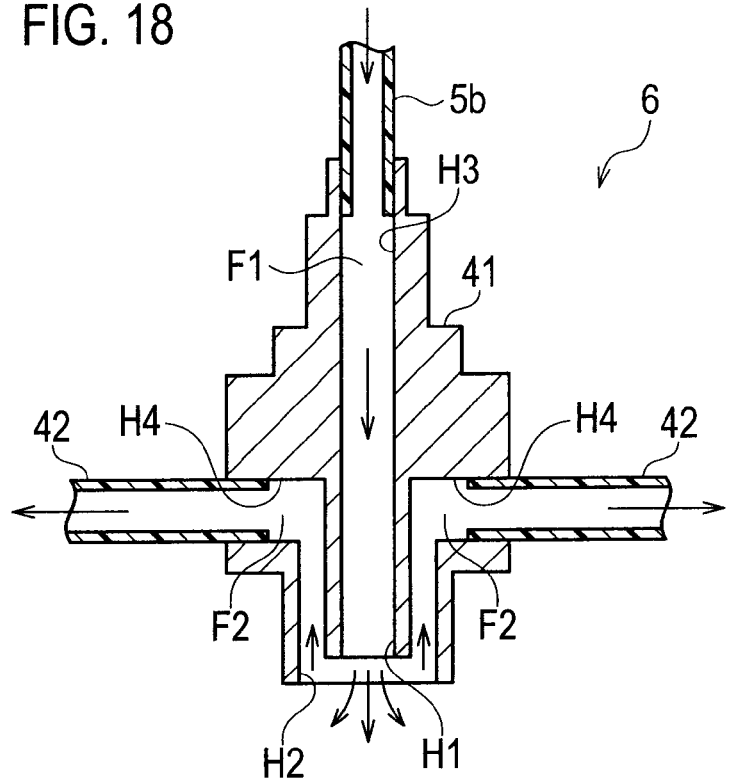
FIG. 18 is a cross-sectional view taken along a line A3-A3 of FIG. 17.

As illustrated in FIGS. 17 and 18, the blower section 6 according to the third embodiment is a nozzle type gas supply and exhaust unit. The blower section 6 includes a cylindrical casing 41, a supply outlet H1 blowing the solvent vapor supplied from the vapor supply section 5, and an exhaust inlet 112 which is provided around the supply outlet H1 and exhausts the surplus of the solvent vapor blown from the supply outlet H1. The casing 41 is of equal size to the coating nozzle of the coating section 4.

The supply outlet H1 is circular and formed in a bottom surface of the casing 41 (in FIG. 18). The supply outlet H1 is connected to a supply inlet H3 through a supply channel F1. The supply inlet 113 is circular and formed in a top surface of the casing 41 (in FIG. 18). The supply channel F1 is cylindrical and serves as a channel allowing the supply outlet H1 to communicate with the supply inlet H3. The supply inlet H3 is connected to the transport line 5b.

The exhaust inlet 112 is formed into a ring shape around the supply outlet H1 and is connected to two exhaust outlets H4 through an exhaust channels F2. The exhaust outlets H4 are circular and formed in the respective side surfaces of the casing 41. The exhaust channel F2 serves as a channel allowing the exhaust inlet H2 to communicate with the two exhaust outlets H4. These exhaust outlets H4 are individually connected to exhaust lines 42.

The aforementioned blower section 6 includes a gas supply function to blow and supply the solvent vapor and a gas exhaust function to exhaust the surplus of the solvent vapor. The blower section 6 has an integrated structure for supply and exhaust gas. Accordingly, the optimized balance between gas supply and exhaust prevents the surplus of the solvent vapor from scattering within the apparatus when the solvent vapor is supplied to the coating film M. The apparatus can be therefore prevented from being contaminated.

Moreover, the nozzle-type blower section 6 has a structure which can be miniaturized. Accordingly, the nozzle-type blower section 6 is provided in the vicinity of the coating section 4, specifically, so as to be positioned behind the coating nozzle in the rotation direction at the same distance from the center of the stage 2 as that of the coating nozzle of the coating section 4 in the radial direction while the solvent vapor is supplied to the coating film M from the blower section 6 just after the coating. This allows the coating and film thickness flattening process to be simultaneously performed, thus simplifying the manufacturing process and shortening the manufacturing time.

Moreover, the blower section 6 is moved together with the second Z-axis movement mechanism 7b in the X-axis direction over the entire surface of the wafer W on the stage 2 by the pair of the first and the second X-axis movement mechanisms 7c and 7d. At this time, the blower section 6 moves in the X-axis direction while continuously blowing the solvent vapor on the coating film M on the wafer W to dissolve the surface layer of the coating film M. The controller 9 controls the rate of solvent vapor to be blown (the supply of solvent vapor) so as to lower the viscosity of the surface layer of the coating film M. The rate of solvent vapor to be blown is adjusted by regulating the flow rate of the carrier gas with the regulation valve 15, changing the temperature setting of the solvent vapor generation unit 5a, or performing the both. The rate of solvent vapor to be blown can be also adjusted by controlling the rotation speed of the rotation mechanism 3 by the controller 9.

In such a manner, the controller 9 adjusts the amount of the solvent vapor depending on circumferential speed at a certain radius from the center of the coating target. In order to keep the amount of the solvent vapor to be blown per unit area constant, the controller 9 increases the supply of the solvent vapor according to increasing the circumferential speed.

If the controller 9 makes control so that very few solvent vapor is supplied to the peripheral edge, it is possible to prevent the formation of the protrusion and improve the film thickness uniformity.

If the controller 9 makes control so that the supply of the solvent vapor varies between the peripheral edge and the inside of the peripheral edge in the coating film M, the supply of the solvent vapor to the peripheral edge can be made small, thus improving the film thickness uniformity.

Furthermore, the controller 9 can also make control so that the viscosity of the coating film M on the wafer W side (the stage side) is not lower than that on the surface layer side. Accordingly, it is possible to prevent the protrusion of the peripheral edge from increasing in height. Moreover, by maintaining the viscosity of the'-coating film M as far as possible on the wafer W side (the stage side) while reducing the viscosity on the surface layer side, the height of the protrusion can be reduced, thus flattening the coating film M.

Moreover, the surplus of the solvent vapor is exhausted. Accordingly, the viscosity distribution of the coating film M can be properly controlled.

As described above, according to the third embodiment, it is possible to provide the same effects as those of the first embodiment. Furthermore, the provision of the exhaust inlets H2 around the supply outlet H1 supplying the solvent vapor facilitates optimization of the amounts of the solvent vapor supplied and exhausted. The solvent vapor can be therefore supplied only to a narrow range just under the supply outlet H1. Accordingly, the surplus of the solvent vapor will not scatter within the apparatus, and the apparatus can be prevented from being contaminated.

Furthermore, the exhaust of the surplus of the solvent vapor allows proper control of the viscosity distribution of the coating film M.

(Fourth Embodiment)

A description will be given of a fourth embodiment with reference to FIG. 19.

The fourth embodiment is a modification of the first embodiment. The description will be given of a part different from the first embodiment, that is, the blower section 6. In the fourth embodiment, the description of the same part as described in the first embodiment will be omitted.

Figure 19:
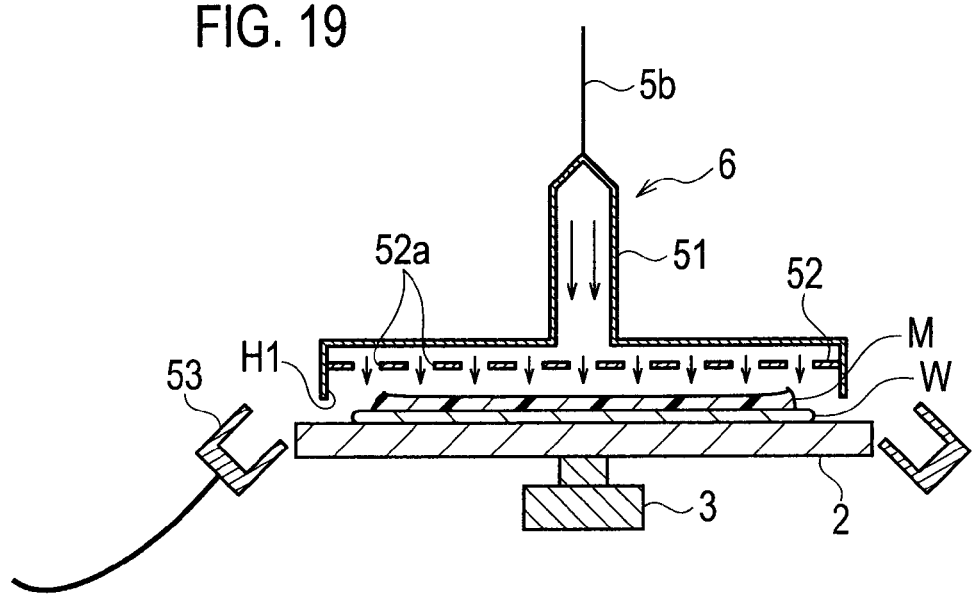
FIG. 19 is an exterior perspective view illustrating a schematic configuration of a blower section provided for a film forming apparatus according to a fourth embodiment.

As illustrated in FIG. 19, the blower section 6 according to the fourth embodiment includes a casing 51 covering the stage 2 and a distribution plate 52 provided in the casing 51. The film forming apparatus 1 includes an exhaust section 53 exhausting the surplus of the solvent vapor. The casing 51 includes a supply outlet H1 of approximately equal size to the wafer W.

The distribution plate 52 includes a plurality of through holes 52a allowing the solvent vapor to pass therethrough and equalizes supply gas. The distribution plate 52 functions as a distribution section. Upper part of the casing 51 is connected to the solvent vapor generation unit 5a through the transport line 5b. The solvent vapor flows down from the upper part of the casing 51 through the distribution plate 52 and is then uniformly supplied to the coating film M of the wafer W on the stage 2. Herein, the distribution section is the distribution plate 52 but not limited to this. The distribution section may be a diffuser, for example.

The exhaust section 53 is an exhaust head configured to exhaust the surplus of the solvent vapor blown out from the blower section 6. The exhaust section 53 is formed into a ring shape surrounding the outer edge of the stage 2. The exhaust section 53 continuously sucks the solvent vapor with a predetermined suction force for exhaust thereof. The exhaust section 53 is connected to a pump generating the predetermined suction force through an exhaust line composed of a tube or a pipe. The pump is electrically connected to the controller 9 and is driven according to the control by the controller 9.

The aforementioned blower section 6 includes the supply outlet H1 of approximately equal size to the wafer W and incorporates the distribution plate 52 properly provided with the plurality of through holes 52a to equalize the supply of solvent vapor in the in-plane direction. This allows the solvent vapor to be distributed and supplied to the coating film M on the wafer W. The supply of the solvent vapor to the coating film M is therefore equalized in the in-plane direction, thus improving the film thickness uniformity.

Furthermore, the viscosity of the coating film M on the wafer W side (the stage side) can be controlled so as not to be lower than that on the surface layer side. Accordingly, it is possible to prevent the protrusion of the peripheral edge from increasing in height. Moreover, if the viscosity of the coating film M is maintained as far as possible on the wafer W side (the stage side) while the viscosity is lowered on the surface layer side, the height of the protrusion can be reduced, thus flattening the coating film M:

Moreover, the solvent vapor flown out from the edge of the wafer W is recovered by the exhaust section 53. Accordingly, the surplus of the solvent vapor does not scatter, and the flow of the solvent vapor on the wafer W is rectified. Especially by optimizing the balance of gas supply and exhaust, it is prevented that the surplus of the solvent vapor scatters in the apparatus when the solvent vapor is supplied to the coating film M. Accordingly, the apparatus can be prevented from being contaminated.

Moreover, the exhaust of the surplus of the solvent vapor allows proper control of the viscosity distribution of the coating film M.

According to the fourth embodiment, the wafer W does not need to rotate in a horizontal plane. However, if the wafer W is rotated while the solvent vapor is blown on the coating film M on the wafer W, variations in the coating film M can be reduced due to the reduced viscosity by the solvent vapor and the centrifugal force by the rotation. Accordingly, the film thickness uniformity of the coating film M can be improved.

As described above, according to the fourth embodiment, it is possible to provide the same effects as those of the first embodiment. Moreover, since the solvent vapor is distributed and supplied, the supply of the solvent vapor is equalized in the coating film M in the in-plane direction. Accordingly, the film thickness uniformity can be improved. Furthermore, the ring-shaped exhaust section 53 exhausting the solvent vapor from the outer edge of the wafer W is provided, and the solvent vapor flowing out from the peripheral edge of the wafer W is exhausted by the exhaust section 53. This can further facilitate optimizing the amounts of the solvent vapor supplied and exhausted. Accordingly, the surplus of the solvent vapor will not scatter within the apparatus, and the apparatus can be prevented from being contaminated.

Furthermore, the exhaust of the surplus of the solvent vapor allows proper control of the viscosity distribution of the coating film M.

(Fifth Embodiment)

A description will be given of a fifth embodiment with reference to FIGS. 20 and 21.

They fifth embodiment is a modification of the first embodiment. The description will be given of a part different from the first embodiment, that is, the blower section 6. In the fifth embodiment, the description of the same part as described in the first embodiment will be omitted.

Figure 20:
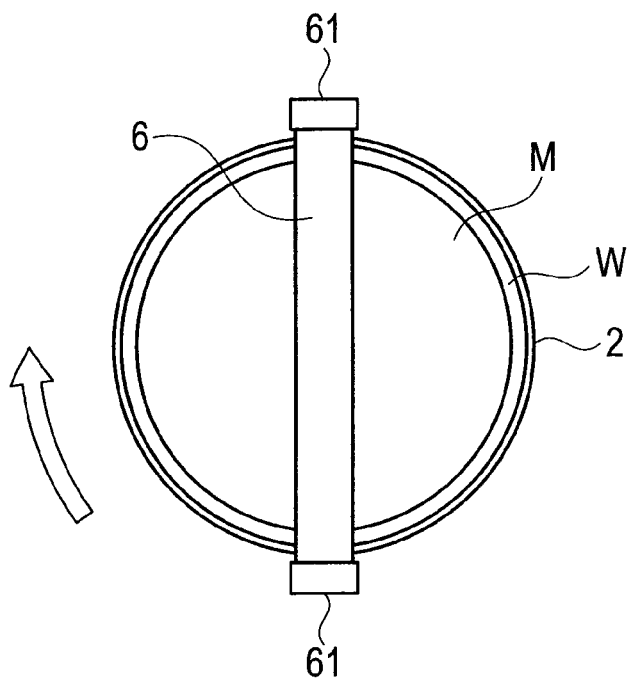
FIG. 20 is a plan view illustrating a schematic configuration of a film forming apparatus according to a fifth embodiment.
Figure 21:
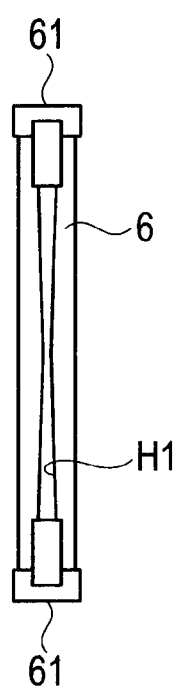
FIG. 21 is a plan view illustrating a supply outlet of a blower section provided for the film forming apparatus illustrated in FIG. 20.

As illustrated in FIGS. 20 and 21, the blower section 6 according to the fifth embodiment includes two adjustment mechanisms 61 configured to adjust the opening area of a slit-shaped supply outlet H1. The adjustment mechanisms 61 are slit length adjustment mechanisms configured to change the slit length of the supply outlet H1 and are provided on both sides of the blower section 6 in the longitudinal direction. The adjustment mechanisms can change a range supplied with the solvent vapor on the wafer W. Changing the length of the slit allows control of the rate of the solvent vapor to be blown on the edge of the wafer W.

Herein, the mechanism changing the slit length may be operated manually or in cooperation with the controller 9.

Moreover, the controller 9 causes the blower section 6 to blow the solvent vapor while rotating the stage 2 through the rotation mechanism 3 with the blower section 6 set facing the wafer W on the stage 2. At the film thickness flattening process, therefore, the solvent vapor is supplied to the wafer W on the rotating stage 2 with the blower section 6 being fixed just above the diameter of the stage 2 and not moving in the X-axis direction.

The supply outlet H1 is formed so that the slit width gradually increases from the longitudinal center toward the peripheral edge. The supply of the solvent vapor gradually increases from the center of the wafer W toward the peripheral edge. Herein, the stage 2 is rotated at the film thickness flattening process, then the circumferential speed of the stage 2 increases from the center toward the peripheral edge. Therefore, in order to maintain the supply of the solvent vapor per unit area to be constant, it is necessary to increase the supply of the solvent vapor from the center toward the peripheral edge. As an example, the supply outlet H1 has a slit width gradually increasing toward the peripheral edge. Moreover, the coating film M gradually increases in thickness from the center toward the peripheral edge due to the centrifugal force in some cases. The supply of solvent vapor can be changed according to the thickness of the coating film M.

Figure 22:
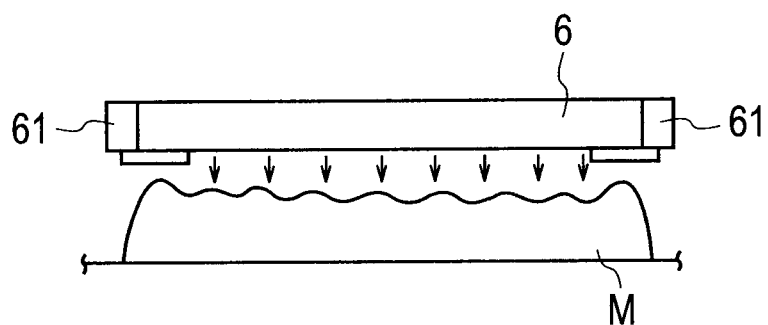
FIG. 22 is an explanatory view for explaining a liquid film subjected to a film thickness flattening process using a slit length adjustment mechanism configured to change slit length.
Figure 23:
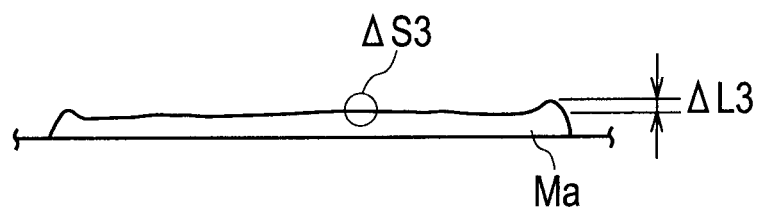
FIG. 23 is an explanatory view for explaining a dried film obtained by performing a drying process for the liquid film illustrated in FIG. 22.

Moreover, in order to reduce the supply of solvent vapor to the peripheral edge of the wafer W, the slit length adjustment mechanisms (the adjustment mechanisms 61) changing the slit length are provided as illustrated in FIG. 22, for example. The peripheral edge of the liquid film therefore has a viscosity very little lowered and maintains the shape. The viscosity of the liquid film can be lowered in part other than the peripheral edge (inside the peripheral edge), resulting in reduction of unevenness. If the thus-obtained liquid film is subjected to drying (baking), the protrusion of the peripheral edge is reduced in height, thus resulting in the dried film Ma with improved flatness in part other than the peripheral edge (inside the peripheral edge) as illustrated in FIG. 23 ($\Delta S3 < \Delta S1$, $\Delta L3 \approx \Delta L1$).

As described above, according to the fifth embodiment, it is possible to provide the same effects as those of the first embodiment. Moreover, by providing the adjustment mechanisms 61 adjusting the opening area of the supply outlet H1, the range supplied with the solvent vapor in the wafer W can be changed. For example, even when the wafer W has a different size, the solvent vapor can be supplied to only the coaling film M on the wafer W according to the size. Accordingly, the surplus of the solvent vapor will not scatter within the apparatus, and the apparatus can be prevented from being contaminated.

Moreover, provision of the adjustment mechanisms 61 capable of regulating the slit length prevents the viscosity of the periphery of the liquid film from being lowered much and maintains the peripheral shape. The viscosity of the liquid film can be reduced in part other than the peripheral edge (inside the peripheral edge), resulting in reduction of unevenness. If the thus-obtained liquid film is subjected to drying (baking), the protrusion of the periphery is reduced in height, thus resulting in a dried film Ma with flatness improved in part other than the peripheral edge (inside the peripheral edge).

In other words, if the solvent vapor is blown on the coating film M to change the viscosity distribution of the coating film M on the wafer W, the change in film shape caused in the wafer W can be prevented. For example, the change in film shape caused in the periphery of the wafer W can be prevented by lowering the viscosity of the coating film M in part other than the peripheral edge (inside the peripheral edge).

In order to lower the viscosity of the coating film M in part other than the peripheral edge (inside the peripheral edge), the range supplied with the solvent vapor can be changed by the adjustment mechanisms 61.

Furthermore, the viscosity of the coating film M on the wafer W side (the stage side) can be controlled so as not to be lower than that on the surface Player side. Accordingly, it is possible to prevent the protrusion of the peripheral edge from increasing in height. Moreover, if the viscosity of the coating film M is maintained as far as possible on the wafer W side (the stage side) while the viscosity is reduced on the surface layer side, the height of the protrusion can be reduced, thus flattening the coating film M.

(Sixth Embodiment)

A description will be given of a sixth embodiment with reference to FIGS. 24 and 25.

The sixth embodiment is a modification of the first embodiment. The description will be given of a part different from the first embodiment, that is, the blower section 6. In the sixth embodiment, the description of the same part as described in the first embodiment will be omitted.

Figure 24:
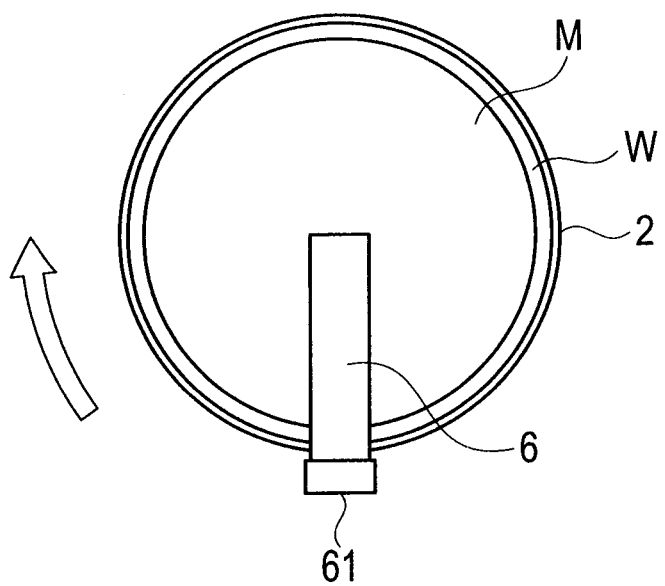
FIG. 24 is a plan view illustrating a schematic structure of a film forming apparatus according to a sixth embodiment.
Figure 25:
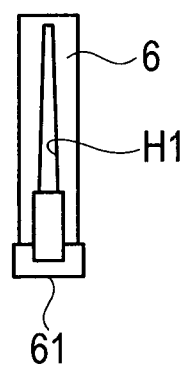
FIG. 25 is a plan view illustrating a supply outlet of a blower section provided for the film forming apparatus illustrated in FIG. 24.

As illustrated in FIGS. 24 and 25, the blower section 6 according to the sixth embodiment includes an adjustment mechanism 61 configured to adjust the opening area of a slit-shaped supply outlet H1. The adjustment mechanism 61 is a slit length adjustment mechanism configured to change the slit length of the supply outlet H1 and is provided at an end of the supply outlet H1 in the longitudinal direction. The adjustment mechanism can change the range supplied with the solvent vapor in the wafer W. The blower section 6 has a length approximately equal to the radius of the stage 2 and is configured to be moved by one of the first and the second X-axis movement mechanisms 7c and 7d.

Moreover, the controller 9 causes the blower section 6 to blow the solvent vapor while rotating the stage 2 with the rotation mechanism 3 with the blower section 6 set facing the wafer W on the stage 2. At the film thickness flattening process, the solvent vapor is supplied to the entire surface of the wafer W on the rotating stage 2 with the blower section 6 being fixed just above the radius of the stage 2 and not moving in the X-axis direction.

The supply outlet H1 is formed so that the slit width gradually increases in the longitudinal direction from the inner part toward the peripheral edge. The supply of the solvent vapor therefore gradually increases from the center of the wafer W toward the peripheral edge. Herein, the stage 2 is rotated at the film thickness flattening process, then the circumferential speed of the stage 2 increases from the center toward the periphery. Therefore, in order to maintain the supply of the solvent vapor per unit area to be constant, it is necessary to increase the supply of the solvent vapor from the center to the periphery. As an example, the supply outlet H1 has a slit width gradually increasing toward the periphery. Moreover, the coating film M gradually increases in thickness from the center toward the periphery due to the centrifugal force in some cases. Accordingly, the supply of the solvent vapor can be changed according to the thickness of the coating film M. The supply rate of the solvent vapor is the same as that described in the fifth embodiment.

Herein, the mechanism changing the slit length may be operated manually or in cooperation with the controller 9.

As described above, according to the sixth embodiment, it is possible to provide the same effects as those of the first embodiment. Moreover, by providing the adjustment mechanism 61 adjusting the opening area of the supply outlet H1, the range supplied with the solvent vapor in the wafer W can be changed. For example, even when the wafer W has a different size, the solvent vapor can be supplied to only the coating film M on the wafer W according to the size. Accordingly, the surplus of the solvent vapor will not scatter within the apparatus, and the apparatus can be prevented from being contaminated. Moreover, the provision of the adjustment mechanism 61 capable of adjusting the slit length can provide the same effects as those of the fifth embodiment.

(Seventh Embodiment)

A description will be given of a seventh embodiment with reference to FIGS. 26 and 27.

The seventh embodiment is a modification of the first embodiment. The description will be given of a part different from the first embodiment, that is, the blower section 6. In the seventh embodiment, the description of the same part as described in the first embodiment will be omitted.

Figure 26:
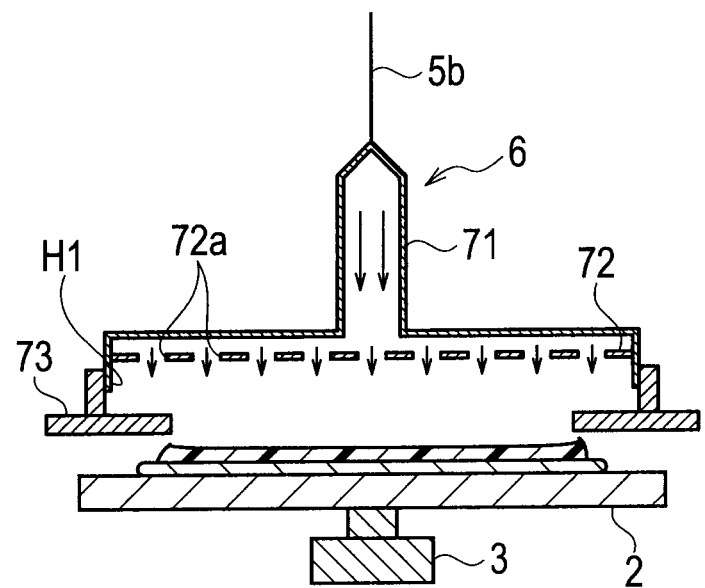
FIG. 26 is a cross-sectional view illustrating a schematic configuration of a blower section provided for a film forming apparatus according to a seventh embodiment.
Figure 27:
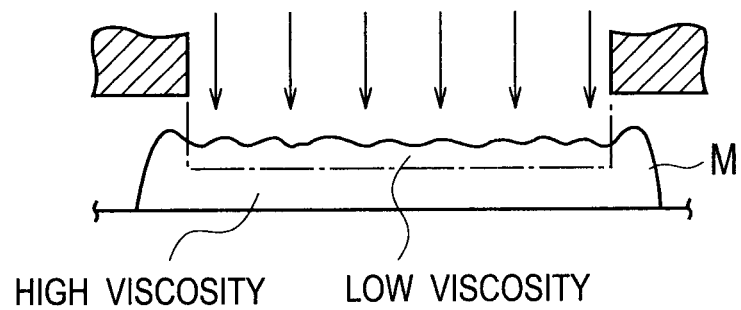
FIG. 27 is an explanatory view for explaining a liquid film subjected to a film thickness flattening process using a mechanical adjustment mechanism composed of a shield plate provided around the supply outlet.

As illustrated in FIG. 26, the blower section 6 according to the seventh embodiment includes a casing 71 covering the stage 2, a distribution plate 72 provided in the casing 71, and an adjustment mechanism 73. The adjustment mechanism 73 is provided in the outer peripheral surface of the casing 71 and configured to adjust the opening area of a circular supply outlet H1. The casing 71 includes the supply outlet H1 of approximately equal size to the wafer W.

The distribution plate 72 includes a plurality of through holes 72a allowing the solvent vapor to pass therethrough and equalizes supply gas. The distribution plate 72 functions as a distribution section. Upper part of the casing 71 is connected to the solvent vapor generation unit 5a through the transport line 5b. The solvent vapor flows down from the upper part of the casing 71 through the distribution plate 72 and is then uniformly supplied to the coating film M of the wafer W on the stage 2. Herein, the distribution section is the distribution plate 72 but not limited to this. The distribution section may be a diffuser, for example.

The adjustment mechanism 73 is a diameter adjustment mechanism configured to change the diameter of the supply outlet H1. The adjustment mechanism 73 is provided on the outer circumferential surface of the blower section 6 so as to cover the peripheral edge of the supply outlet H1. It is therefore possible to change the range supplied with the solvent vapor in the wafer W.

The controller 9 causes the blower section 6 to blow the solvent vapor while rotating the stage 2 through the rotation mechanism 3 with the blower section 6 set facing the wafer W on the stage 2. At the film thickness flattening process, the solvent vapor is supplied to the wafer W on the rotating stage 2 with the blower section 6 being fixed just above the stage 2 and not moving in the X-axis direction.

According to the seventh embodiment, the supply outlet H1 is circular, and it is unnecessary to rotate the wafer W in a horizontal plane.

The supply of the solvent vapor is the same as that described in the fifth embodiment, but the description will be given of control of the supply rate of the solvent vapor to the peripheral edge for further flattening of the coating film M. The above-described ΔL1 and ΔS1 have a tradeoff relation, and the description will be given of an example to eliminate the same.

In order to control the amount of the solvent vapor supplied to the peripheral edge, a mechanical shield plate (the adjustment mechanism 73) is provided at the peripheral edge of the discharge outlet H1, as illustrated in FIG. 26. Accordingly, the peripheral edge of the liquid film has viscosity not lowered much and maintains the shape. The viscosity of the liquid film can be lowered in part other than the peripheral edge (inside the peripheral edge), thus reducing the unevenness. If the thus-obtained liquid film is subjected to drying (baking), the protrusion of the peripheral edge is reduced in height, thus resulting in a dried film Ma with improved flatness in part other than the peripheral edge (inside the peripheral edge) as illustrated in FIG. 23 ($\Delta S3 < \Delta S1$, $\Delta L3 \approx \Delta L1$). It is desirable that the temperature of the shield plate is controlled so as to be not lower than the dew-point temperature in order to prevent condensation on the shield plate.

As described above, when the solvent vapor is blown on the coating film M to change the viscosity distribution of the coating film M on the wafer W, the change in film shape caused in the wafer W can be prevented. For example, the change in film shape caused in the peripheral edge of the wafer W can be prevented by lowering the viscosity of the coating film M in part other than the peripheral edge thereof (inside the peripheral edge).

In order to lower the viscosity in part other than the peripheral edge (part surrounded the peripheral edge), the solvent vapor is blown by the adjustment mechanism 73 only to a predetermined region.

As described above, according to the seventh embodiment, it is possible to provide the same effects as those of the first embodiment. Moreover, the solvent vapor is distributed and supplied to the coating film M on the wafer W. The supply of the coating film M is uniform in the in-plane direction, thus improving the film thickness uniformity. Moreover, by providing the adjustment mechanism 71 adjusting the opening area of the supply outlet H1, the range supplied with the solvent vapor in the wafer W can be changed. For example, even when the wafer W has a different size, the solvent vapor can be supplied to only the coating film M on the wafer W according to the size. Accordingly, the surplus of the solvent vapor will not scatter within the apparatus, and the apparatus can be prevented from being contaminated.

Moreover, by providing the adjustment mechanism 73 composed of a mechanical shield plate at the peripheral edge (the opening) of the supply outlet H1 thereby adjusting the supply of the solvent vapor at the peripheral edge, the viscosity of the peripheral edge of the liquid film is lowered very little, and the shape of the peripheral edge is maintained. The viscosity of the liquid film can be lowered in part other than the peripheral edge (inside the peripheral edge), thus reducing the unevenness. If the thus-obtained liquid film is subjected to drying (baking), the protrusion of the periphery is reduced in height, thus resulting in a dried film Ma with improved flatness.

Furthermore, the viscosity of the coating film M on the wafer W side (the stage side) can be controlled so as not to be lower than that on the surface layer side. Accordingly, it is possible to prevent the protrusion of the peripheral edge from increasing in height. Moreover, if the viscosity of the coating film M is maintained as far as possible on the wafer W side (the stage side) while being lowered on the surface layer side, the protrusion can be reduced in height, thus flattening the coating film M.

(Eighth Embodiment)

A description will be given of a seventh embodiment with reference to FIGS. 28 and 29.

The eighth embodiment is an application example of the film forming apparatus 1 according to the first embodiment applied to a film forming system 81. Accordingly, the description will be given of a part different from the first embodiment. In the eighth embodiment, the description of the same part as described in the first embodiment will be omitted.

Figure 28:
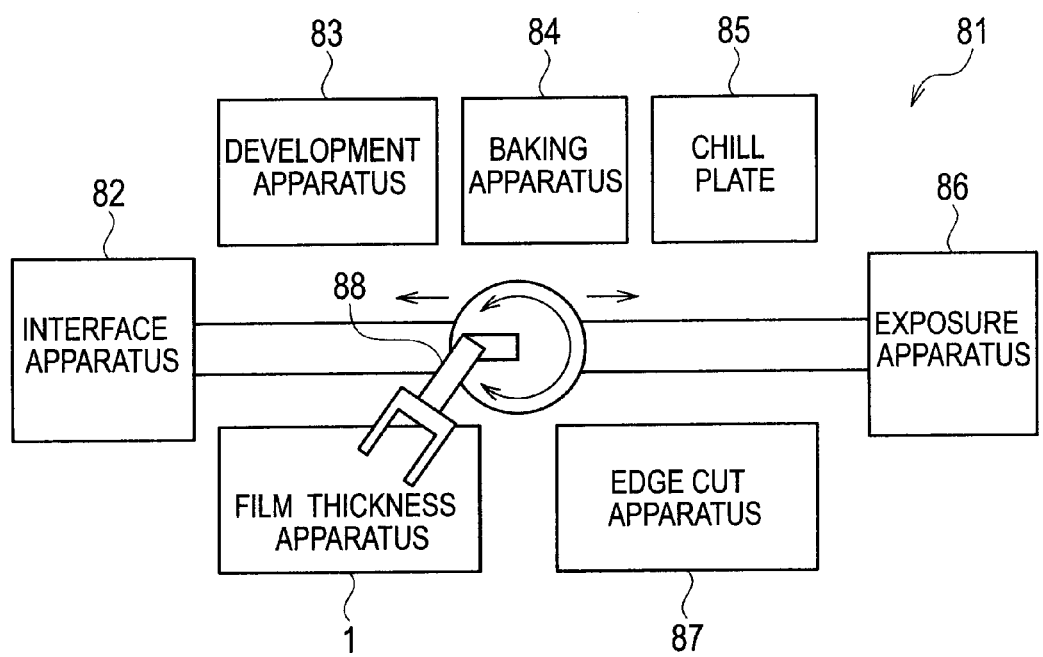
FIG. 28 is a block diagram illustrating a schematic configuration of a film forming system according to an eighth embodiment.

As illustrated in FIG. 28, the film forming system 81 according to the eighth embodiment includes: a film forming apparatus 1 applying a photosensitive material to the wafer W; an interface apparatus 82 into which the wafer W is introduced; a development apparatus 83 developing the coating film M on the wafer W; a baking apparatus 84 drying the coating film M on the wafer W; a chill plate 85 cooling the coating film M on the wafer W; an exposure apparatus 86 exposing the coating film M on the wafer W; an edge cut apparatus 87 performing edge cut to remove unnecessary part of the outer edge of the coating film M on the wafer W by thinner; and a transport apparatus 88 transporting the wafer W throughout each of the apparatuses.

The description will be given of a film forming process (film forming method) performed by the film forming system 81. A controller of the film forming system 81 executes the film forming process based on various programs.

Figure 29:
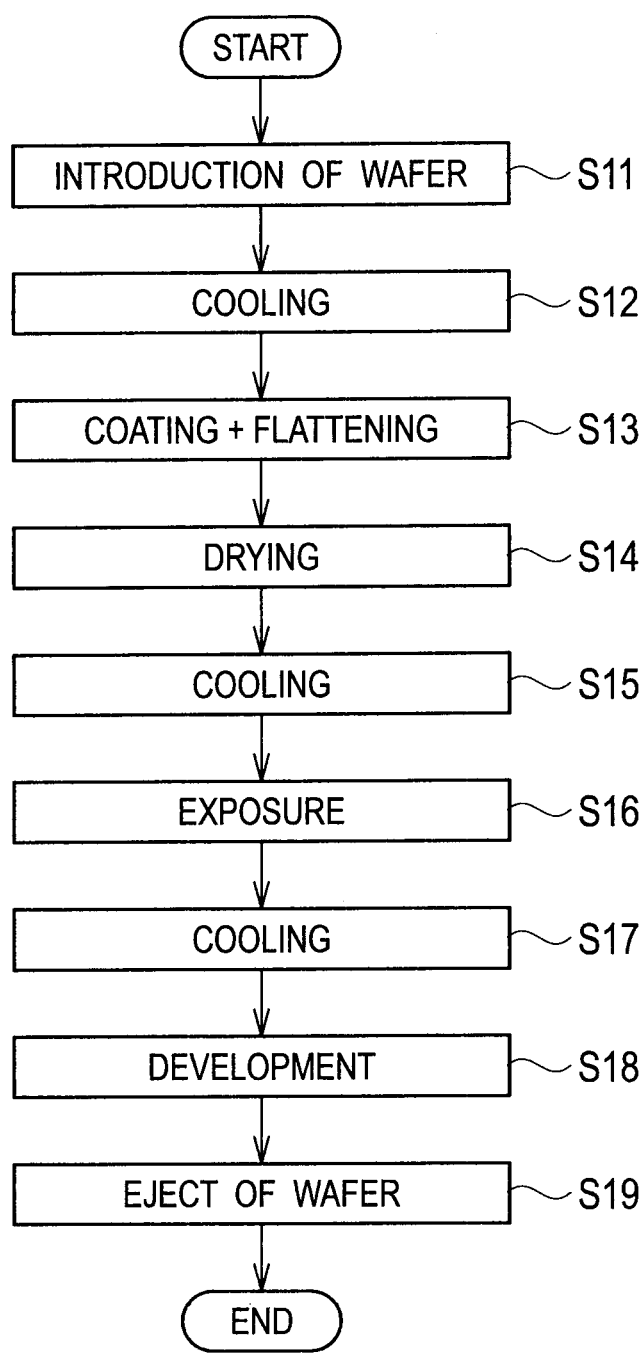
FIG. 29 is a flowchart illustrating a flow of a film forming process performed by the film forming system illustrated in FIG. 28.

As illustrated in FIG. 29, first, the wafer W subjected to cleansing and pretreatment and accommodated in a cassette is set in the interface apparatus 82, and the introduction of the wafer W is accepted (step S11). Secondly, the wafer W is taken out from the cassette by the transport apparatus 88; transported and placed on the chill plate 85; and then cooled for a predetermined period of time (step S12).

After the predetermined period of time, the wafer W is taken out from the chill plate 85 and transported to the film forming apparatus 1, where the photosensitive material is applied on the wafer W by the film forming apparatus 1 for forming the coating film M and the coating film M is subjected to the film thickness flattening process (step S13). The coating and film thickness flattening process at this time are the same as those of the first embodiment (see FIG. 3).

Subsequently, the wafer W is sequentially transported by the transportation apparatus 88 and heated by the baking apparatus 84 to dry the coating film M (step S14). The wafer W is then cooled by the chill plate 85 (step S15), and then the coating film M (the dried film Ma) on the wafer W is exposed by the exposure apparatus 86 (step S16).

Furthermore, the wafer W is cooled again by the chill plate 85 (step S17), and the coating film M (the dry film Ma) on the wafer W is developed and cleansed by the development apparatus 83 (step S18). The wafer W is then returned to the interface apparatus 82 by the transportation apparatus 88 and then ejected (step S19). The process is thus completed. Thereafter, the wafer W is diced to produce a plurality of semiconductor devices, such as semiconductor chips.

Since the process uses the coating method capable of forming a film on a limited area, such as the spiral coating, the dot coating, and the dispenser coating, instead of the spin coating, the edge cut process can be eliminated. Accordingly, the edge cut apparatus 87 is eliminated, thus resulting in lower price of the film forming system 81.

As described above, according to the eighth embodiment, it is possible to obtain the same effects as those of the first embodiment. Furthermore, by applying the above described film forming apparatus 1 to the film forming system 81, the coating method capable of forming a film on a limited area such as the spiral coating, the dot coating, and the dispenser coating can be used instead of the spin coating, and the material is applied to only the predetermined region of the coating surface of the wafer W. The edge cut process can be therefore eliminated. The edge cut apparatus 87 can be removed, thus lowering the price of the film forming system 81.

Accordingly, it is possible to use a coating method other than the spin coating, such as the spiral coating and the dot coating. By using such a coating method, the material can be applied to only a predetermined region of the coating surface of the wafer W compared to the spin coating. This can prevent the material scattering or turned into mist from sticking to the side or rear surface of the wafer W. Moreover, the processes called edge cut and back rinse after the coating process are unnecessary, and the regular replacement of the cup is also unnecessary. It is therefore possible to achieve an increase in material use efficiency, reduction in burden on the environment, and prevention of reduction in availability while maintaining the film thickness uniformity.

(Other Embodiments)

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the aforementioned embodiments, the coating target is the wafer W but is not limited to this. The coating target can be a circular or a non-circular glass substrate or the like.

What is claimed is:

1. A film forming apparatus, comprising:
    a stage on which a coating target is placed;
    a coater for applying a material to a predetermined region on the coating target placed on the stage to form a coating film;
    a vapor supplier for generating solvent vapor capable of dissolving the coating film, the vapor supplier including a tank reserving the solvent, a first heater for heating the solvent in the tank thereby generating the solvent vapor, and a temperature sensor measuring a temperature of the solvent vapor in the tank;
    a blower for receiving the solvent vapor from the vapor supplier and for blowing the solvent vapor generated by the vapor supplier onto the coating film on the coating target placed on the stage;
    a transport line communicating the vapor supplier with the blower, the transport line for transporting the solvent vapor to the blower;
    a second heater for heating the transport line;
    a third heater for heating the blower; and a controller configured to control an amount of the solvent vapor to be blown by the blower by adjusting a temperature of the first heater based on the temperature measured by the temperature sensor so that the coating film is dissolved, to control the second heater so that a temperature of the transport line is higher than a dew-point temperature of the solvent vapor, and to control the third heater so that a temperature of the blower is higher than the dew-point temperature of the solvent vapor;

wherein viscosity in a part of the coating film on a surface layer side is lower than that in a part thereof on the coating target side, and the viscosity in the part on the surface layer side and the viscosity of the coating target side take such values that prevent the coating film on the coating target from spreading upward near the peripheral edge preventing profusion of the peripheral edge from increasing in height not more than about 2 nm from the edge of the coating film.

2. The film forming apparatus according to claim 1, wherein
the controller is configured to control the blower so that the solvent vapor is blown on a surface layer inside a peripheral edge of the coating film.

3. The film forming apparatus according to claim 1, wherein
the controller is configured to control the amount of the solvent vapor to be blown by the blower based on at least one of a flow rate of carrier gas for the solvent vapor and temperature generating the solvent vapor.

4. The film forming apparatus according to claim 1, further comprising:
a rotation mechanism for rotating the stage in a horizontal plane, wherein
the controller is configured to cause the rotation mechanism to rotate the stage while causing the coater to form the coating film.

5. The film forming apparatus according to claim 1, further comprising
a dryer for drying the coating film on the coating target on which the solvent vapor is blown by the blower.

6. A semiconductor device manufactured by the film forming apparatus according to claim 1.

7. The film forming apparatus according to claim 1, wherein the second heater is wrapped around an outer surface of the transport line.

8. The film forming apparatus according to claim 7, wherein the second heater is a sheet-formed heater.

9. The film forming apparatus according to claim 1, wherein the third heater is attached to an outer surface of the blower.

10. The film forming apparatus according to claim 9, wherein the third heater is a sheet-formed heater.

11. The film forming apparatus according to claim 1, wherein the controller is configured to control the amount of the solvent vapor to be blown by the blower to reduce the viscosity of 60% of a thickness of the coating film from the surface.

* * * * *